US012772586B2

(12) United States Patent
Cheng et al.

(10) Patent No.: US 12,772,586 B2
(45) Date of Patent: Oct. 20, 2026

(54) IMAGE SENSOR

(71) Applicant: TAIWAN SEMICONDUCTOR MANUFACTURING CO., LTD., Hsinchu (TW)

(72) Inventors: Yun-Wei Cheng, Taipei City (TW); Chun-Hao Chou, Tainan City (TW); Yin-Chieh Huang, Tainan City (TW); Wan-Chen Huang, Kaohsiung City (TW); Zhe-Ju Liu, Taoyuan City (TW); Kuo-Cheng Lee, Tainan City (TW); Chi-Cherng Jeng, Tainan City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 740 days.

(21) Appl. No.: 18/298,351

(22) Filed: Apr. 10, 2023

(65) Prior Publication Data

US 2023/0246047 A1 Aug. 3, 2023

Related U.S. Application Data

(63) Continuation of application No. 17/019,078, filed on Sep. 11, 2020, now Pat. No. 11,626,435, which is a continuation of application No. 15/985,351, filed on May 21, 2018, now Pat. No. 10,777,592, which is a continuation of application No. 14/080,555, filed on Nov. 14, 2013, now Pat. No. 9,978,790.

(51) Int. Cl.
*H10F 39/00* (2025.01)

(52) U.S. Cl.
CPC ....... *H10F 39/8053* (2025.01); *H10F 39/024* (2025.01); *H10F 39/8063* (2025.01); *H10F 39/8067* (2025.01)

(58) Field of Classification Search
CPC .......................... H10F 39/8053; H10F 39/807
See application file for complete search history.

(56) References Cited

U.S. PATENT DOCUMENTS

| | | | | |
|---|---|---|---|---|
| 5,514,888 | A | 5/1996 | Sano et al. | |
| 9,978,790 | B2 | 5/2018 | Cheng et al. | |
| 10,777,592 | B2 | 9/2020 | Cheng et al. | |
| 2006/0077268 | A1 * | 4/2006 | Yokozawa .......... | H10F 39/8057 348/E9.01 |
| 2007/0145439 | A1 | 6/2007 | Han | |
| 2007/0148846 | A1 | 6/2007 | Hyun | |

(Continued)

*Primary Examiner* — Christopher A Johnson
(74) *Attorney, Agent, or Firm* — Eschweiler & Potashnik, LLC

(57) ABSTRACT

An image sensor includes a substrate, a first photosensitive unit, a second photosensitive unit, a buffer layer, a dielectric grid, a first color filter, and a second color filter. The first photosensitive unit and the second photosensitive unit are in the substrate. The buffer layer covers the substrate, the first photosensitive unit and the second photosensitive unit. The dielectric grid is over the buffer layer and between the first photosensitive unit and the second photosensitive unit. The dielectric grid has a round top surface. The first color filter is over the first photosensitive unit. The first color filter is in contact with the round top surface and the buffer layer. The second color filter is over the second photosensitive unit.

20 Claims, 16 Drawing Sheets

(56) References Cited

U.S. PATENT DOCUMENTS

| | | | | |
|---|---|---|---|---|
| 2009/0189055 | A1 | 7/2009 | Lin et al. | |
| 2010/0245637 | A1 | 9/2010 | Itonaga | |
| 2012/0267745 | A1 | 10/2012 | Tsuji | |
| 2013/0015326 | A1* | 1/2013 | Tamura | H10F 39/8037 257/290 |
| 2013/0134536 | A1 | 5/2013 | Mori et al. | |
| 2015/0123229 | A1* | 5/2015 | Momono | H10F 39/8053 257/432 |

* cited by examiner

IMAGE SENSOR

CROSS-REFERENCE TO RELATED APPLICATION

This present application is a continuation application of U.S. patent application Ser. No. 17/019,078, filed Sep. 11, 2020, which is now U.S. Pat. No. 11,626,435, issued Apr. 11, 2023, which is a continuation application of U.S. patent application Ser. No. 15/985,351, filed May 21, 2018, which is now U.S. Pat. No. 10,777,592, issued Sep. 15, 2020, which is a continuation application of U.S. patent application Ser. No. 14/080,555, filed Nov. 14, 2013, which is now U.S. Pat. No. 9,978,790, issued May 22, 2018, all of which are herein incorporated by reference in their entirety.

BACKGROUND

The present disclosure relates to an image sensor, and more particularly, to a structure and method for reducing optical crosstalk in an image sensor.

In semiconductor technology, an image sensor is used for sensing a volume of exposed light projected towards it to form an image. For converting various photo energy of the light into electrical signals, the image sensor of a semiconductor provides a grid of pixels which may contain photosensitive diodes, reset transistors, source follower transistors, pinned layer photodiodes, and/or transfer transistors. Common types of the pixel grids include a complementary metal-oxide-semiconductor (CMOS) image sensor (CIS), an active-pixel sensor (APS), a passive-pixel sensor and a charged-coupled device (CCD) sensor. These sensors are widely used in various applications such as digital still camera or mobile phone camera devices.

However, the grid of pixels of the image sensors may suffer from crosstalk while incident light targeted for one pixel grid of an image sensor element traverses other neighboring image sensor elements. As a result, a blaze of light having an overflow of electrons may occur due to the undesired light that spread across other the adjacent image sensor elements, so as to reduce overall optical sensitivity and result in poor color separation. Accordingly, improvements in structures and methods for fabricating the image sensor continue to be sought.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1A:
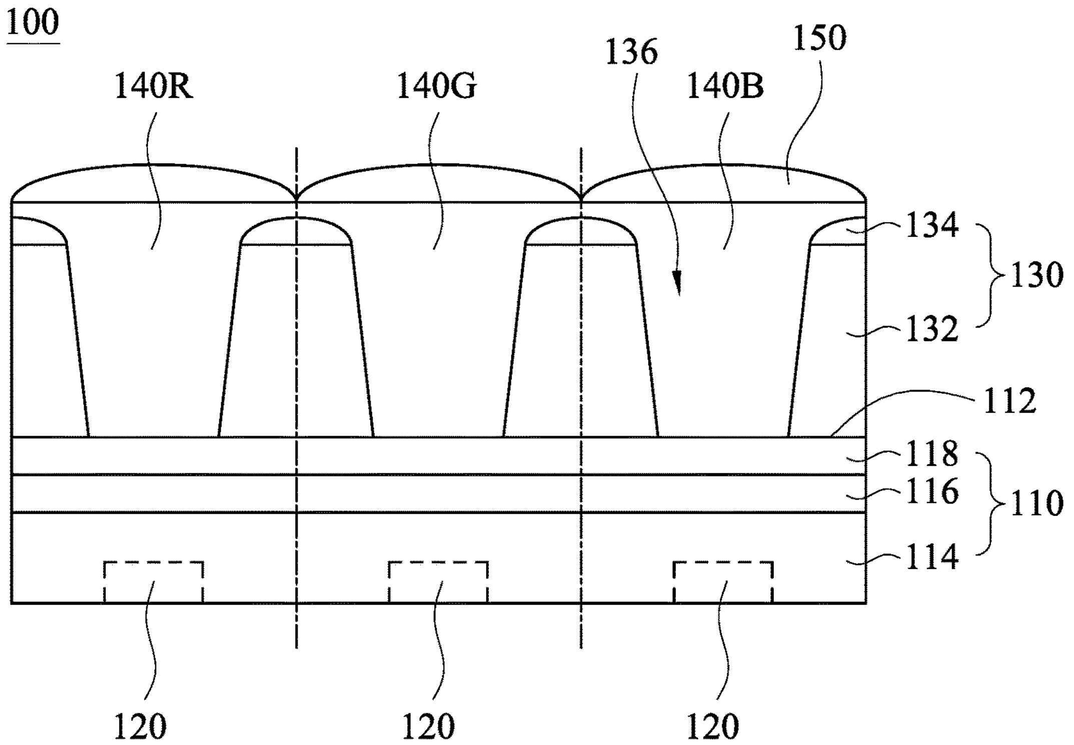
FIG. 1A is a schematic cross-sectional view of an image sensor according to various embodiments of the present disclosure.

The embodiments of image sensors and a method for manufacturing the same of the present disclosure are discussed in detail below, but not limited the scope of the present disclosure. The same symbols or numbers are used to the same or similar portion in the drawings or the description. The applications of the present disclosure are not limited by the following embodiments and examples which the person in the art can apply in the related field.

The singular forms "a," "an" and "the" used herein include plural referents unless the context clearly dictates otherwise. Therefore, reference to, for example, a grid layer includes embodiments having two or more such grid layers, unless the context clearly indicates otherwise. Reference throughout this specification to "one embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, the figures are intended; rather, these figures are intended for illustration.

FIG. 1A is a schematic cross-sectional view of an image sensor 100 according to various embodiments of the present disclosure. In FIG. 1A, the image sensor 100 includes a substrate 110, an array of photosensitive units 120, a grid 130, a plurality of color filters 140R, 140G and 140B and a plurality of micro-lenses 150.

The substrate 110 includes a semiconductor substrate 114, an anti-reflective layer 116 and a buffer layer 118. The anti-reflective layer 116 is disposed on the semiconductor substrate 114, and the buffer layer 118 is disposed on the anti-reflective layer 116. According to various embodiments of the present disclosure, the semiconductor substrate 114 is a silicon substrate. According to various embodiments of the present disclosure, the material of the anti-reflective layer 116 is a high-K material including hafnium oxide ($HfO_2$), tantalum oxide ($Ta_2O_5$), zirconium oxide ($ZrO_2$) or aluminum oxide ($Al_2O_3$). According to various embodiments of the present disclosure, the material of the buffer layer 118 is a dielectric material including silicon oxide (SiO), silicon nitride (SiN) or silicon oxynitride (SiON).

The array of photosensitive units 120 is disposed within the substrate 110. More particularly, the array of photosensitive units 120 is disposed within the semiconductor substrate 114 of the substrate 110.

In FIG. 1A, the substrate 110 has a surface 112, and the grid 130 is disposed on the surface 112 of the substrate 110. The grid 130 has a first portion 132, a second portion 134 and a plurality of openings 136. The openings 136 are individually aligned to the photosensitive units 120. According to various embodiments of the present disclosure, the material of the grid 130 is a dielectric material including silicon oxide (SiO), silicon nitride (SiN) or silicon oxynitride (SiON).

The second portion 134 is disposed on the first portion 132. Referring to FIG. 1A, the cross-sectional view of the first portion 132 is in trapezoid, and the cross-sectional view of the second portion 134 is in semi-ellipse. In various embodiments of the present disclosure, the cross-sectional view of the second portion may be in semi-circle.

The color filters 140R, 140G and 140B are individually disposed within the openings 136 of the grid 130 and individually aligned to the photosensitive units 120. In FIG. 1A, the color filters 140R, 140G and 140B contact the substrate 110, and more particularly, the color filters 140R, 140G and 140B contact the buffer layer 118 of the substrate 110. In various embodiments of the present disclosure, the color filter 140R is a red color filter, the color filter 140G is a green color filter, and the color filter 140B is a blue color filter.

In various embodiments of the present disclosure, the refractive index of the color filters 140R, 140G and 140B is greater than the refractive index of the grid 130. In various embodiments of the present disclosure, the array of color filters 140R, 140G and 140B covers the grid 130, and has a planarized co-plane.

The micro-lenses 150 are disposed on the color filters 140R, 140G and 140B. More particularly, the micro-lenses 150 are disposed on the planarized co-plane composed of the color filters 140R, 140G and 140B.

Figure 1B:
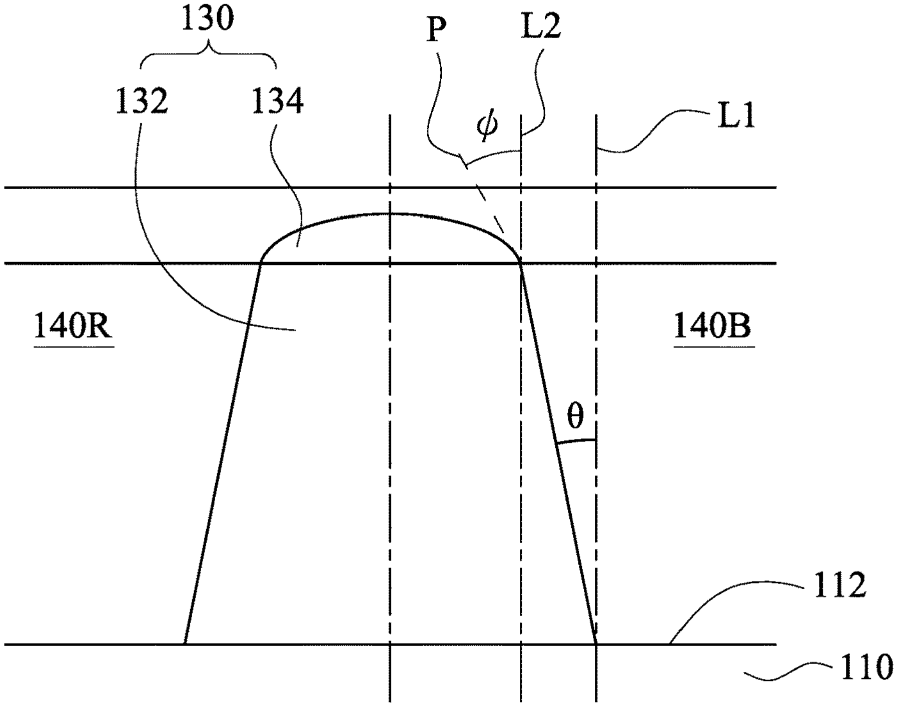
FIGS. 1B-1C are partial enlarged drawings of FIG. 1A.

FIG. 1B is a partial enlarged drawing of FIG. 1A. In FIG. 1B, there are a first angle θ between a normal L1 of the surface 112 of the substrate 110 and a surface of the first portion 132 and a second angle φ between the normal L2 of the surface 112 of the substrate 110 and at least one surface or at least one tangent plane P of the surface of the second portion 134. The second angle φ is greater than the first angle θ.

Figure 1C:
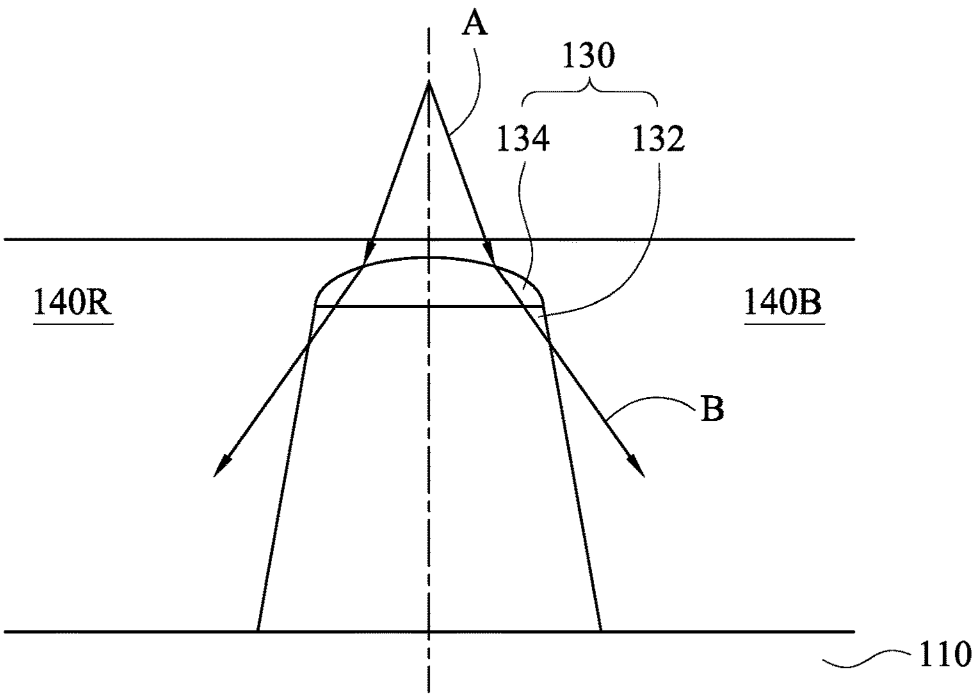

Referring to FIG. 1C, an incident light A enters into the grid 130 through the color filter 140B (or 140R). Because the refractive index of the color filters 140R, 140G and 140B is greater than the refractive index of the grid 130, the convex profile of the second portion 134 can cause the incident light A defocusing. In FIG. 1C, the incident light A is refracted from the color filter 140B (or 140R) into the second portion 134 of the grid 130, and formed a refractive light B. And then the refractive light B is refracted from the first portion 132 of the grid 130 into the same color filter 140B (or 140R), so that the refractive light B cannot occur crosstalk resulting in poor color separation.

Figure 2:
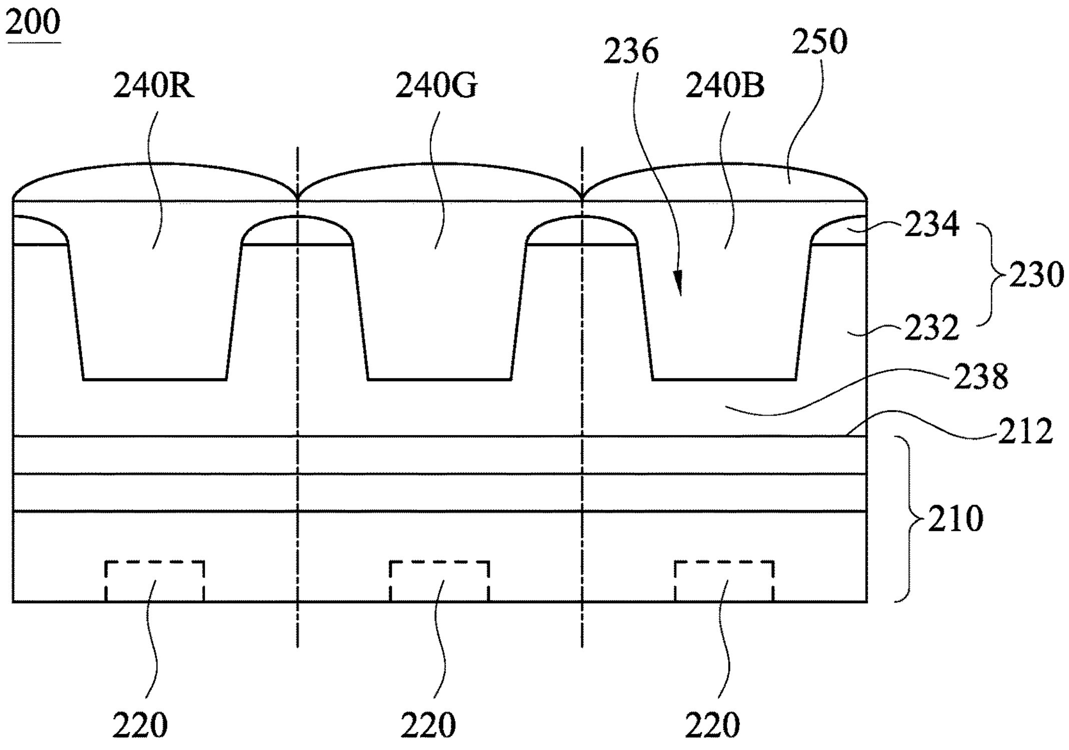
FIGS. 2-8 are schematic cross-sectional views of image sensors according to various embodiments of the present disclosure.

FIG. 2 is a schematic cross-sectional view of an image sensor 200 according to various embodiments of the present disclosure. In FIG. 2, the image sensor 200 includes a substrate 210, an array of photosensitive units 220, a grid 230, a plurality of color filters 240R, 240G and 240B and a plurality of micro-lenses 250.

In FIG. 2, the array of photosensitive units 220 is disposed within the substrate 210. The substrate 210 has a surface 212, and the grid 230 is disposed on the surface 212 of the substrate 210. The grid 230 has a first portion 232, a second portion 234 and a plurality of openings 236. The openings 236 are individually aligned to the photosensitive units 220. The second portion 234 is disposed on the first portion 232. Referring to FIG. 2, the cross-sectional view of the first portion 232 is in trapezoid, and the cross-sectional view of the second portion 234 is in semi-ellipse.

The color filters 240R, 240G and 240B are individually disposed within the openings 236 of the grid 230 and individually aligned to the photosensitive units 220. The refractive index of the color filters 240R, 240G and 240B is greater than the refractive index of the grid 230. In various embodiments of the present disclosure, the array of color filters 240R, 240G and 240B covers the grid 230, and has a planarized co-plane.

The micro-lenses 250 are disposed on the color filters 240R, 240G and 240B. More particularly, the micro-lenses 250 are disposed on the planarized co-plane composed of the color filters 240R, 240G and 240B.

Different from the image sensor 100 in FIG. 1A, the grid 230 of the image sensor 200 has a grid layer 238 sandwiched between the substrate 210 and the color filters 240R, 240G and 240B. The material of the grid layer 238 is same as the material of the grid 230.

Figure 3:
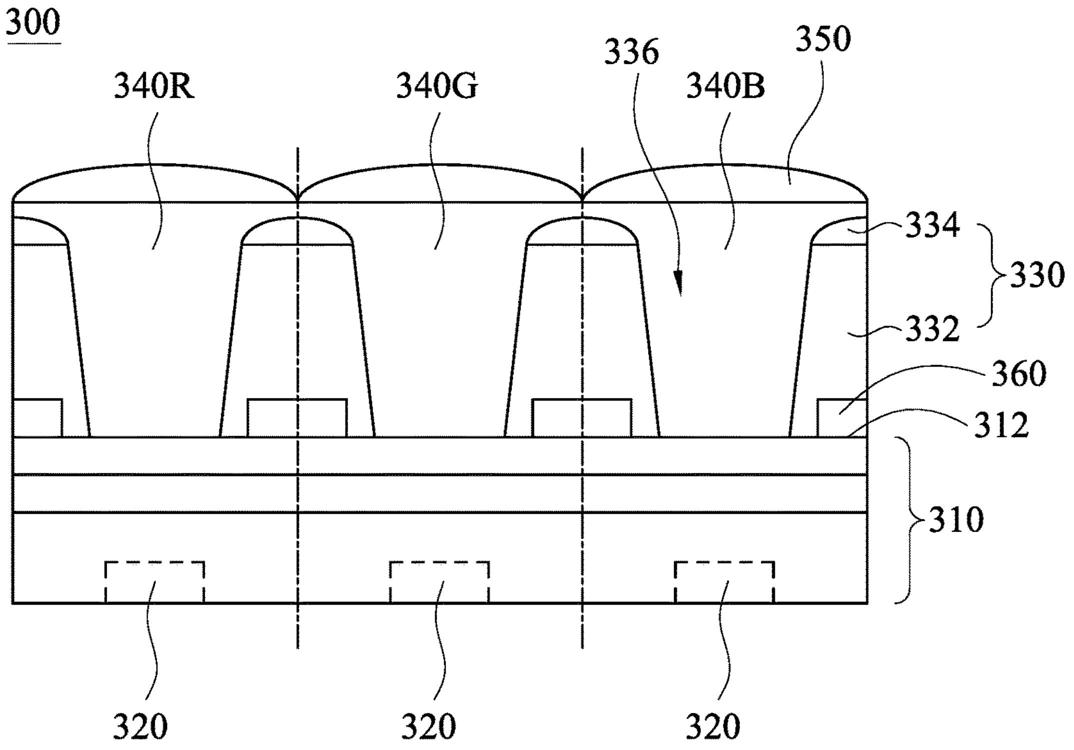

FIG. 3 is a schematic cross-sectional view of an image sensor 300 according to various embodiments of the present disclosure. In FIG. 3, the image sensor 300 includes a substrate 310, an array of photosensitive units 320, a first grid 330, a second grid 360, a plurality of color filters 340R, 340G and 340B and a plurality of micro-lenses 350.

In FIG. 3, the array of photosensitive units 320 is disposed within the substrate 310. The substrate 310 has a surface 312, and the first grid 330 is disposed on the surface 312 of the substrate 310. The first grid 330 has a first portion 332, a second portion 334 and a plurality of first openings 336. The first openings 336 are individually aligned to the photosensitive units 320. The second portion 334 is disposed on the first portion 332. Referring to FIG. 3, the cross-sectional view of the first portion 332 is in trapezoid, and the cross-sectional view of the second portion 334 is in semi-ellipse.

The color filters 340R, 340G and 340B are individually disposed within the first openings 336 of the first grid 330 and individually aligned to the photosensitive units 320. In FIG. 3, the color filters 340R, 340G and 340B contact the substrate 310. The refractive index of the color filters 340R, 340G and 340B is greater than the refractive index of the first grid 330. In various embodiments of the present disclosure, the array of color filters 340R, 340G and 340B covers the first grid 330, and has a planarized co-plane.

The micro-lenses 350 are disposed on the color filters 340R, 340G and 340B. More particularly, the micro-lenses 350 are disposed on the planarized co-plane composed of the color filters 340R, 340G and 340B.

Different from the image sensor 100 in FIG. 1A, the image sensor 300 further includes the second grid 360. The second grid 360 is disposed on the surface 312 of the substrate 310, and then the first grid 330 covers the second grid 360. The second grid 360 have a plurality of second openings, and the second openings are individually aligned to the first openings 336. According to various embodiments of the present disclosure, the material of the second grid 360 is a metal grid, and the metal includes titanium (Ti), tungsten (W), aluminum (Al), copper (Cu) and the combination thereof.

Figure 4:
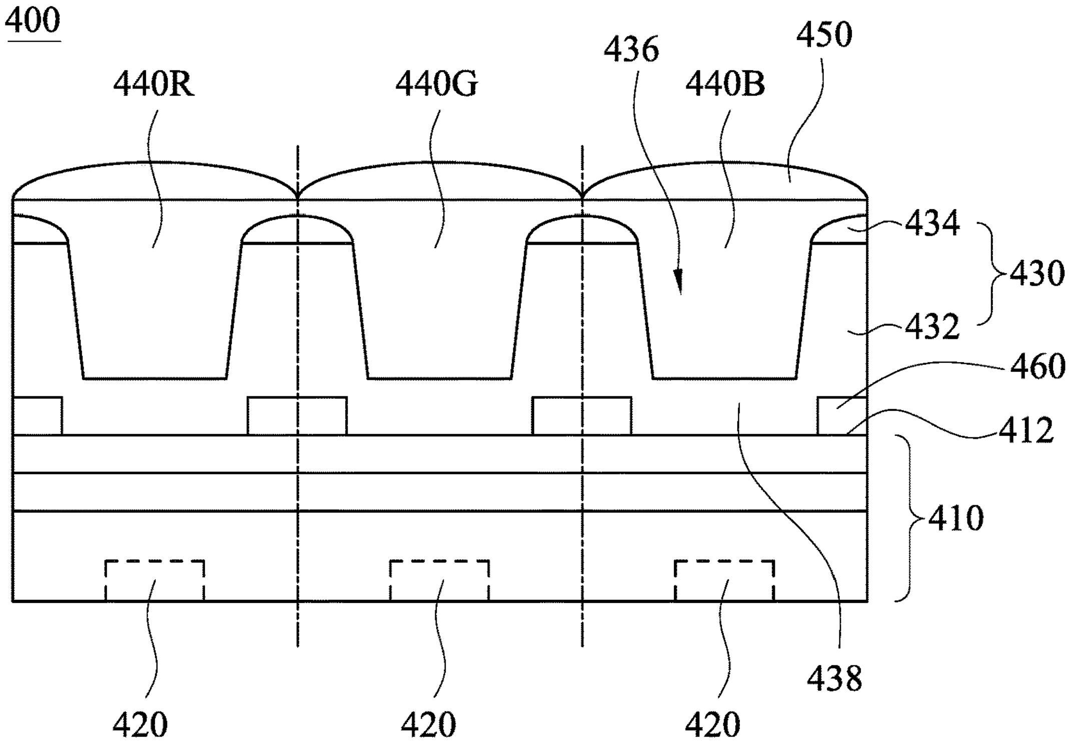

FIG. 4 is a schematic cross-sectional view of an image sensor 400 according to various embodiments of the present disclosure. In FIG. 4, the image sensor 400 includes a substrate 410, an array of photosensitive units 420, a first grid 430, a second grid 460, a plurality of color filters 440R, 440G and 440B and a plurality of micro-lenses 450.

In FIG. 4, the array of photosensitive units 420 is disposed within the substrate 410. The substrate 410 has a surface 412, and the first grid 430 is disposed on the surface 412 of the substrate 410. The first grid 430 has a first portion 432, a second portion 434 and a plurality of first openings 436. The first openings 436 are individually aligned to the photosensitive units 420. The second portion 434 is disposed on the first portion 432. Referring to FIG. 4, the cross-sectional view of the first portion 432 is in trapezoid, and the cross-sectional view of the second portion 434 is in semi-ellipse.

The second grid 460 is disposed on the surface 412 of the substrate 410, and then the first grid 430 covers the second grid 460. The second grid 460 have a plurality of second openings, and the second openings are individually aligned to the first openings 436.

The color filters 440R, 440G and 440B are individually disposed within the first openings 436 of the grid 430 and individually aligned to the photosensitive units 420. The refractive index of the color filters 440R, 440G and 440B is greater than the refractive index of the grid 430. In various embodiments of the present disclosure, the array of color filters 440R, 440G and 440B covers the grid 430, and has a planarized co-plane.

The micro-lenses 450 are disposed on the color filters 440R, 440G and 440B. More particularly, the micro-lenses 450 are disposed on the planarized co-plane composed of the color filters 440R, 440G and 440B.

Different from the image sensor 300 in FIG. 3, the first grid 430 of the image sensor 400 has a first grid layer 438 sandwiched between the substrate 410 and the color filters 440R, 440G and 440B. The material of the grid layer 438 is same as the material of the grid 430.

Figure 5:
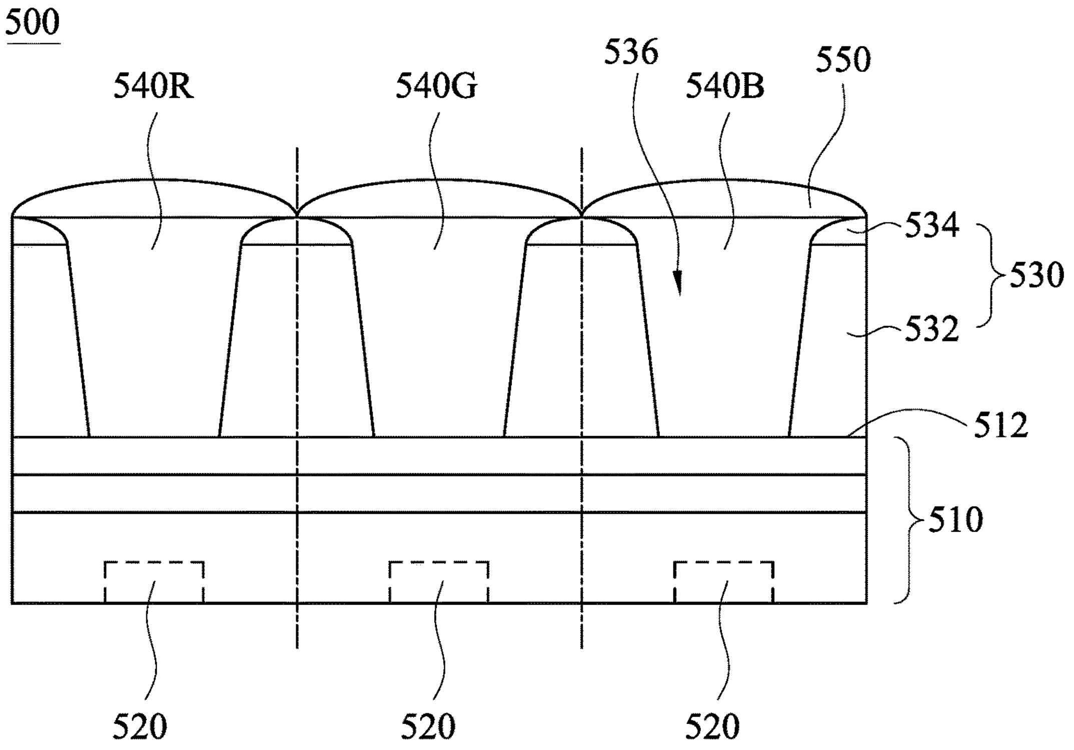

FIG. 5 is a schematic cross-sectional view of an image sensor 500 according to various embodiments of the present disclosure. In FIG. 5, the image sensor 500 includes a substrate 510, an array of photosensitive units 520, a grid 530, a plurality of color filters 540R, 540G and 540B and a plurality of micro-lenses 550.

In FIG. 5, the array of photosensitive units 520 is disposed within the substrate 510. The substrate 510 has a surface 512, and the grid 530 is disposed on the surface 512 of the substrate 510. The grid 530 has a first portion 532, a second portion 534 and a plurality of openings 536. The openings 536 are individually aligned to the photosensitive units 520. The second portion 534 is disposed on the first portion 532. Referring to FIG. 5, the cross-sectional view of the first portion 532 is in trapezoid, and the cross-sectional view of the second portion 534 is in semi-ellipse.

The color filters 540R, 540G and 540B are individually disposed within the openings 536 of the grid 530 and individually aligned to the photosensitive units 520. In FIG. 5, the color filters 540R, 540G and 540B contact the substrate 510. The refractive index of the color filters 540R, 540G and 540B is greater than the refractive index of the grid 530.

Different from the image sensor 100 in FIG. 1A, the grid 530 and the array of color filters 540R, 540G and 540B have a planarized co-plane. The micro-lenses 550 are disposed on the grid 530 and the color filters 540R, 540G and 540B. More particularly, the micro-lenses 550 are disposed on the planarized co-plane composed of the grid 530 and the array of color filters 540R, 540G and 540B.

Figure 6:
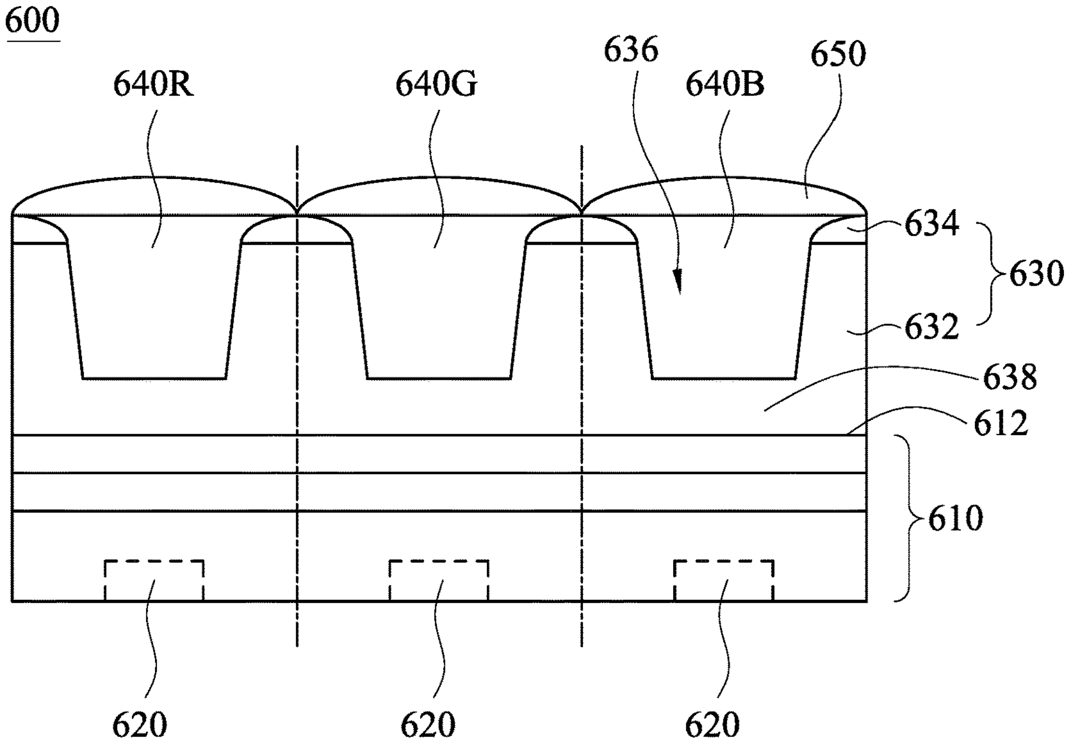

FIG. 6 is a schematic cross-sectional view of an image sensor 600 according to various embodiments of the present disclosure. In FIG. 6, the image sensor 600 includes a substrate 610, an array of photosensitive units 620, a grid 630, a plurality of color filters 640R, 640G and 640B and a plurality of micro-lenses 650.

In FIG. 6, the array of photosensitive units 620 is disposed within the substrate 610. The substrate 610 has a surface 612, and the grid 630 is disposed on the surface 612 of the substrate 610. The grid 630 has a first portion 632, a second portion 634 and a plurality of openings 636. The openings 636 are individually aligned to the photosensitive units 620. The second portion 634 is disposed on the first portion 632. Referring to FIG. 6, the cross-sectional view of the first portion 632 is in trapezoid, and the cross-sectional view of the second portion 634 is in semi-ellipse.

The color filters 640R, 640G and 640B are individually disposed within the openings 636 of the grid 630 and individually aligned to the photosensitive units 620. The refractive index of the color filters 640R, 640G and 640B is greater than the refractive index of the grid 630. The grid 630 and the array of color filters 640R, 640G and 640B have a planarized co-plane.

The micro-lenses 650 are disposed on the grid 630 and the color filters 640R, 640G and 640B. More particularly, the micro-lenses 650 are disposed on the planarized co-plane composed of the grid 630 and the array of color filters 640R, 640G and 640B.

Different from the image sensor 500 in FIG. 5, the grid 630 of the image sensor 600 has a grid layer 638 sandwiched between the substrate 610 and the color filters 640R, 640G and 640B. The material of the grid layer 638 is same as the material of the grid 630.

Figure 7:
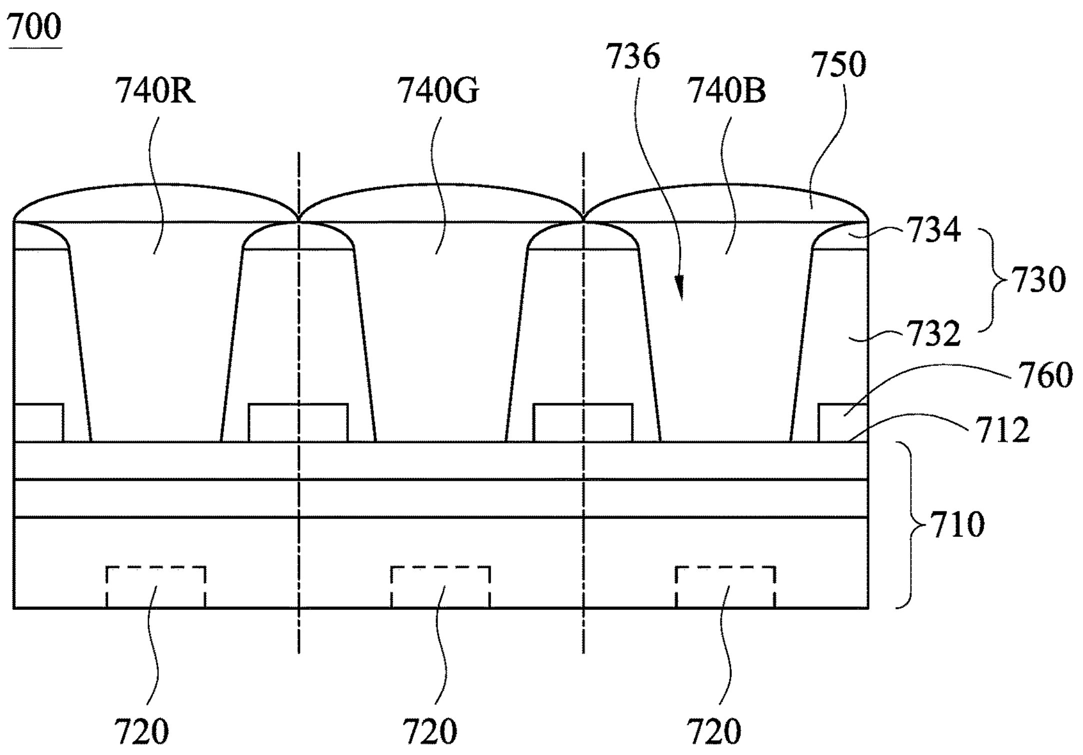

FIG. 7 is a schematic cross-sectional view of an image sensor 700 according to various embodiments of the present disclosure. In FIG. 7, the image sensor 700 includes a substrate 710, an array of photosensitive units 720, a first grid 730, a second grid 760, a plurality of color filters 740R, 740G and 740B and a plurality of micro-lenses 750.

In FIG. 7, the array of photosensitive units 720 is disposed within the substrate 710. The substrate 710 has a surface 712, and the first grid 730 is disposed on the surface 712 of the substrate 710. The first grid 730 has a first portion 732, a second portion 734 and a plurality of first openings 736. The first openings 736 are individually aligned to the photosensitive units 720. The second portion 734 is disposed on the first portion 732. Referring to FIG. 7, the cross-sectional view of the first portion 732 is in trapezoid, and the cross-sectional view of the second portion 734 is in semi-ellipse.

The color filters 740R, 740G and 740B are individually disposed within the first openings 736 of the grid 730 and individually aligned to the photosensitive units 720. In FIG. 7, the color filters 740R, 740G and 740B contact the substrate 710. The refractive index of the color filters 740R, 740G and 740B is greater than the refractive index of the first grid 730. The first grid 730 and the array of color filters 740R, 740G and 740B have a planarized co-plane.

The micro-lenses 750 are disposed on the first grid 730 and the color filters 740R, 740G and 740B. More particularly, the micro-lenses 750 are disposed on the planarized co-plane composed of the first grid 730 and the array of color filters 740R, 740G and 740B.

Different from the image sensor 500 in FIG. 5, the image sensor 700 further includes the second grid 760. The second grid 760 is disposed on the surface 712 of the substrate 710, and then the first grid 730 covers the second grid 760. The second grid 760 have a plurality of second openings, and the second openings are individually aligned to the first openings 736. According to various embodiments of the present disclosure, the material of the second grid 760 is a metal grid, and the metal includes titanium (Ti), tungsten (W), aluminum (Al), copper (Cu) and the combination thereof.

Figure 8:
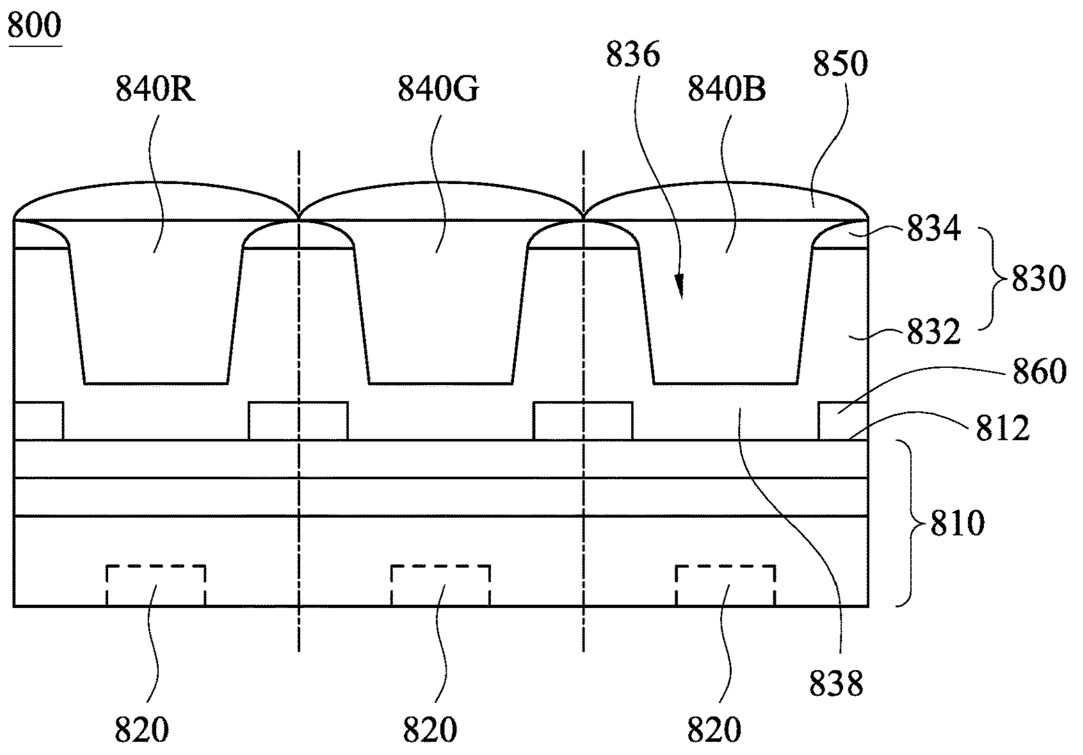

FIG. 8 is a schematic cross-sectional view of an image sensor 800 according to various embodiments of the present disclosure. In FIG. 8, the image sensor 800 includes a substrate 810, an array of photosensitive units 820, a first grid 830, a second grid 860, a plurality of color filters 840R, 840G and 840B and a plurality of micro-lenses 850.

In FIG. 8, the array of photosensitive units 820 is disposed within the substrate 810. The substrate 810 has a surface 812, and the first grid 830 is disposed on the surface 812 of the substrate 810. The first grid 830 has a first portion 832, a second portion 834 and a plurality of first openings 836. The first openings 836 are individually aligned to the photosensitive units 820. The second portion 834 is disposed on the first portion 832. Referring to FIG. 8, the cross-sectional view of the first portion 832 is in trapezoid, and the cross-sectional view of the second portion 834 is in semi-ellipse.

The color filters 840R, 840G and 840B are individually disposed within the first openings 836 of the grid 830 and individually aligned to the photosensitive units 820. The refractive index of the color filters 840R, 840G and 840B is greater than the refractive index of the first grid 830. The first grid 830 and the array of color filters 840R, 840G and 840B have a planarized co-plane.

The second grid 860 is disposed on the surface 812 of the substrate 810, and then the first grid 830 convers the second grid 860. The second grid 860 have a plurality of second openings, and the second openings are individually aligned to the first openings 836.

The micro-lenses 850 are disposed on the first grid 830 and the color filters 840R, 840G and 840B. More particularly, the micro-lenses 850 are disposed on the planarized co-plane composed of the first grid 830 and the array of color filters 840R, 840G and 840B.

Different from the image sensor 700 in FIG. 7, the first grid 830 of the image sensor 800 has a first grid layer 838 sandwiched between the substrate 810 and the color filters 840R, 840G and 840B. The material of the first grid layer 838 is same as the material of the first grid 830.

Figure 9A:
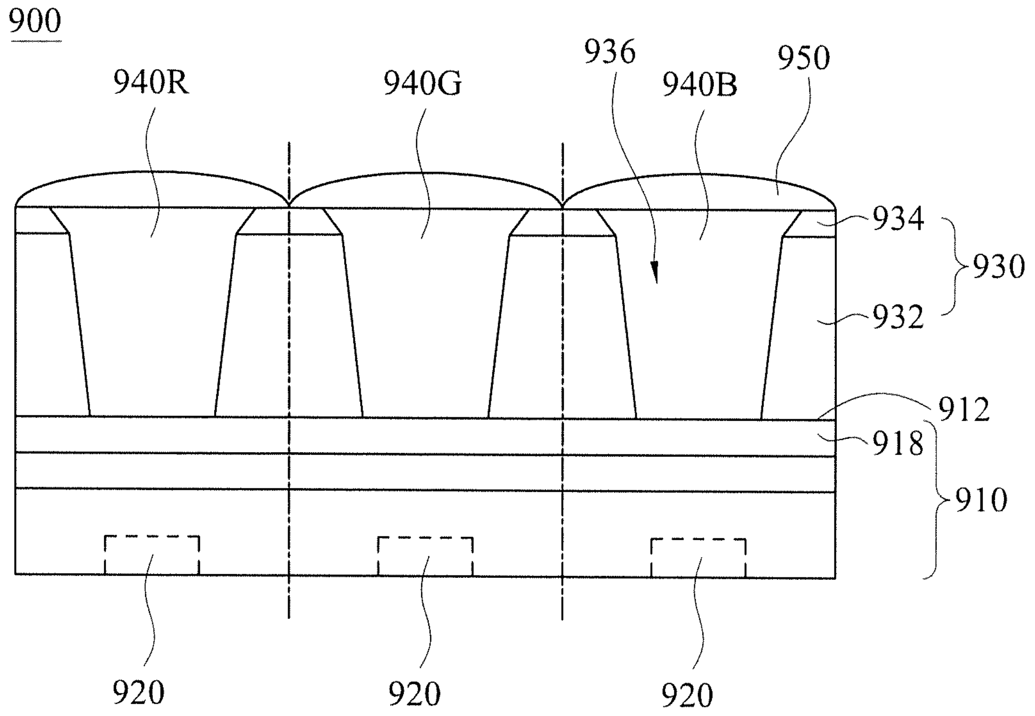
FIG. 9A is a schematic cross-sectional view of an image sensor according to various embodiments of the present disclosure.

FIG. 9A is a schematic cross-sectional view of an image sensor 900 according to various embodiments of the present disclosure. In FIG. 9A, the image sensor 900 includes a substrate 910, an array of photosensitive units 920, a grid 930, a plurality of color filters 940R, 940G and 940B and a plurality of micro-lenses 950.

In FIG. 9A, the array of photosensitive units 920 is disposed within the substrate 910. The substrate 910 has a surface 912, and the grid 930 is disposed on the surface 912 of the substrate 910. The grid 930 has a first portion 932, a second portion 934 and a plurality of openings 936. The openings 936 are individually aligned to the photosensitive units 920. According to various embodiments of the present disclosure, the material of the grid 930 is a dielectric material including silicon oxide (SiO), silicon nitride (SiN) or silicon oxynitride (SiON).

The second portion 934 is disposed on the first portion 932. Referring to FIG. 9A, the cross-sectional view of the first portion 932 is in trapezoid, and the cross-sectional view of the second portion 934 is in trapezoid.

The color filters 940R, 940G and 940B are individually disposed within the openings 936 of the grid 930 and individually aligned to the photosensitive units 920. In FIG. 9A, the color filters 940R, 940G and 940B contact the substrate 910, and more particularly, the color filters 940R, 940G and 940B contact the buffer layer 918 of the substrate 910. In various embodiments of the present disclosure, the color filter 940R is a red color filter, the color filter 940G is a green color filter, and the color filter 940B is a blue color filter.

In various embodiments of the present disclosure, the refractive index of the color filters 940R, 940G and 940B is greater than the refractive index of the grid 930. In various embodiments of the present disclosure, the grid 930 and the array of color filters 940R, 940G and 940B have a planarized co-plane.

The micro-lenses 950 are disposed on the grid 930 and the color filters 940R, 940G and 940B. More particularly, the micro-lenses 950 are disposed on the planarized co-plane composed of the grid 930 and the color filters 940R, 940G and 940B.

Figure 9B:
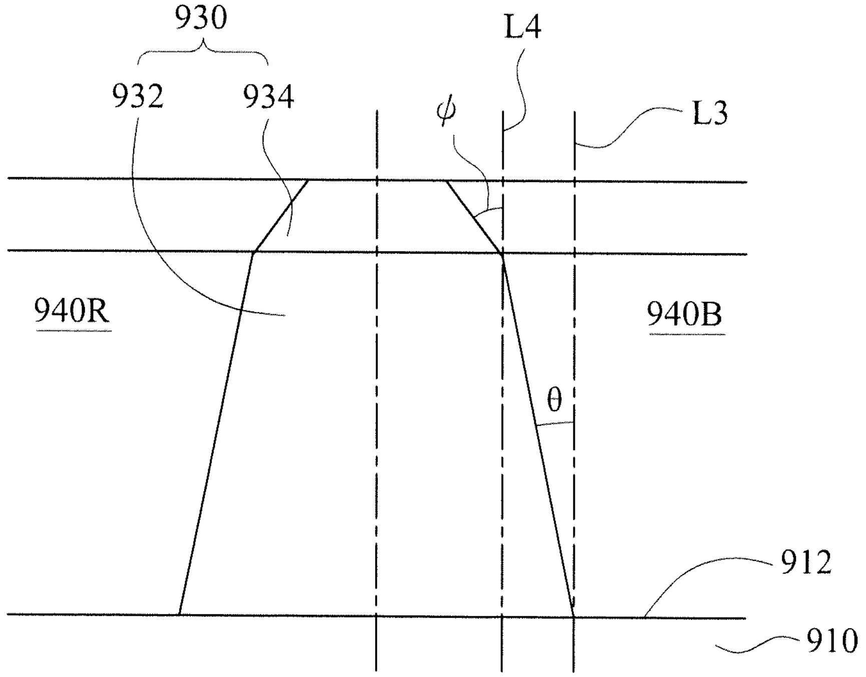
FIGS. 9B-9C are partial enlarged drawings of FIG. 9A.

FIG. 9B is a partial enlarged drawing of FIG. 9A. In FIG. 9B, there are a first angle θ between a normal L3 of the surface 912 of the substrate 910 and a surface of the first portion 932 and a second angle φ between the normal L4 of the surface 912 of the substrate 910 and at least one surface of the second portion 934. The second angle φ is greater than the first angle θ.

Figure 9C:
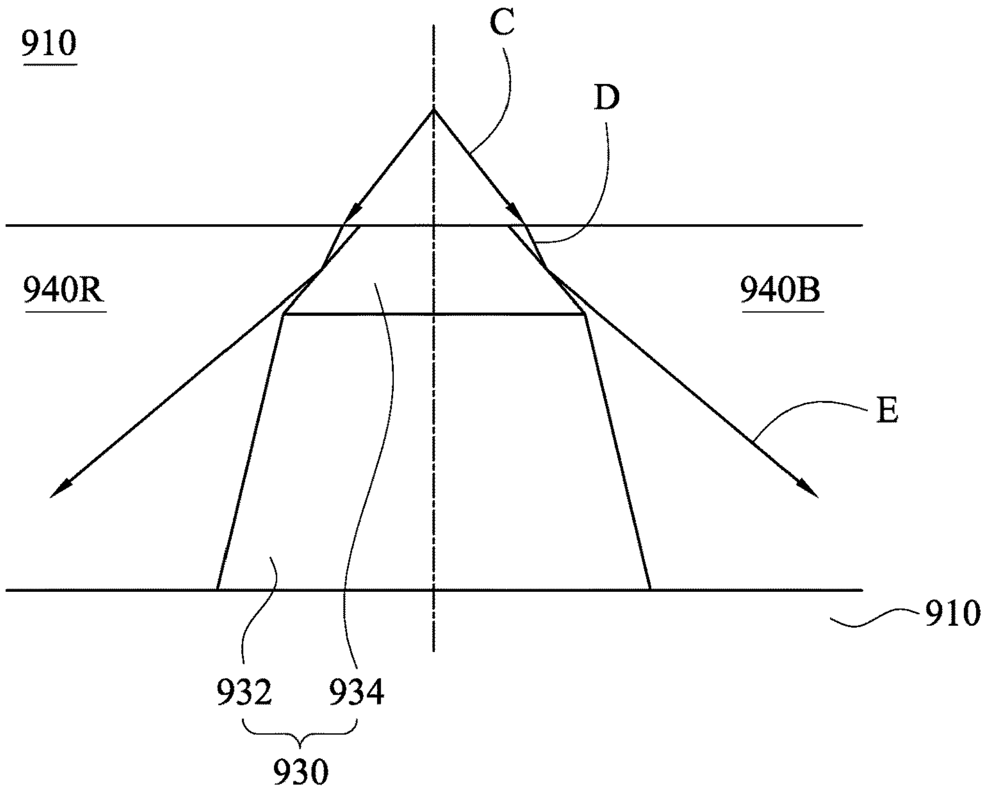

Referring to FIG. 9C, an incident light C enters into the color filter 940B (or 940R) to form a refractive light D. Because the refractive index of the color filters 940R, 940G and 940B is greater than the refractive index of the grid 930, and the incident angle of the refractive light D is higher, the refractive light D can perform total reflection on the surface of the second portion 934 to form a reflective light E. In FIG. 9C, the reflective light E can enter into the same color filter 940B (or 940R), so that the reflective light E cannot occur crosstalk resulting in poor color separation.

Figure 10:
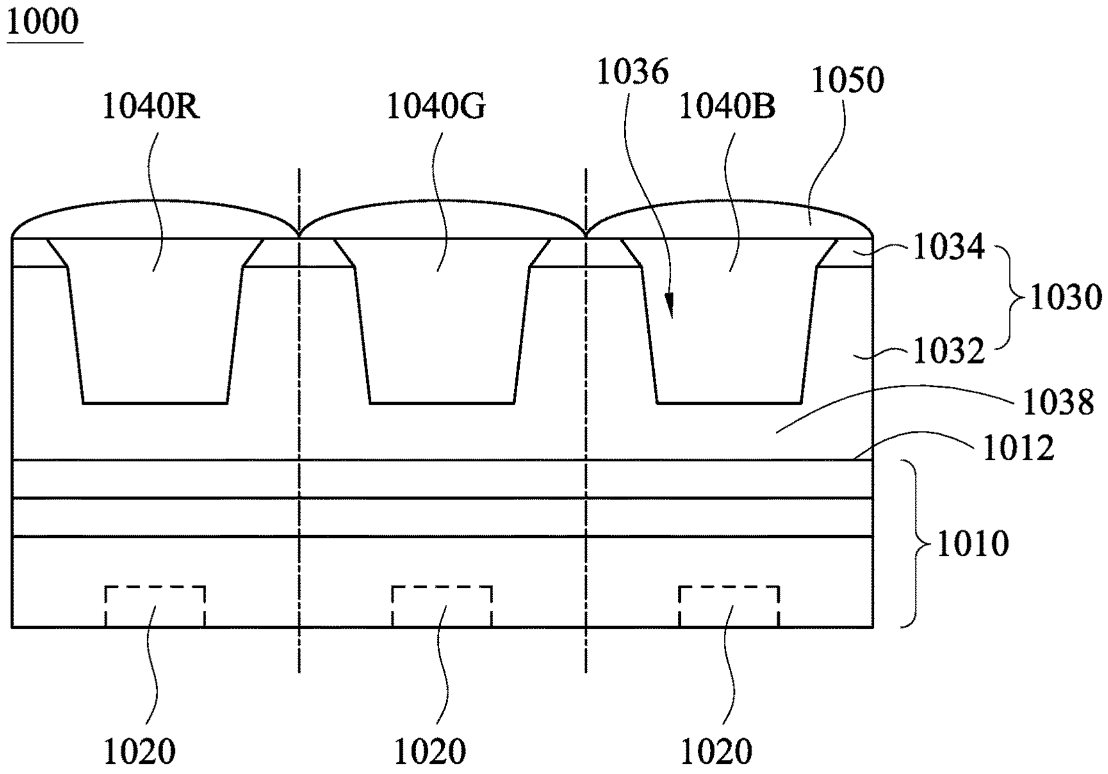
FIGS. 10-20 are schematic cross-sectional views of image sensors according to various embodiments of the present disclosure.

FIG. 10 is a schematic cross-sectional view of an image sensor 1000 according to various embodiments of the present disclosure. In FIG. 10, the image sensor 1000 includes a substrate 1010, an array of photosensitive units 1020, a grid 1030, a plurality of color filters 1040R, 1040G and 1040B and a plurality of micro-lenses 1050.

In FIG. 10, the array of photosensitive units 1020 is disposed within the substrate 1010. The substrate 1010 has a surface 1012, and the grid 1030 is disposed on the surface 1012 of the substrate 1010. The grid 1030 has a first portion 1032, a second portion 1034 and a plurality of openings 1036. The openings 1036 are individually aligned to the photosensitive units 1020. The second portion 1034 is disposed on the first portion 1032. Referring to FIG. 10, the cross-sectional view of the first portion 1032 is in trapezoid, and the cross-sectional view of the second portion 1034 is in trapezoid.

The color filters 1040R, 1040G and 1040B are individually disposed within the openings 1036 of the grid 1030 and individually aligned to the photosensitive units 1020. The refractive index of the color filters 1040R, 1040G and 1040B is greater than the refractive index of the grid 1030. In various embodiments of the present disclosure, the grid 1030 and the array of color filters 1040R, 1040G and 1040B have a planarized co-plane.

The micro-lenses 1050 are disposed on the grid 1030 and the color filters 1040R, 1040G and 1040B. More particularly, the micro-lenses 1050 are disposed on the planarized co-plane composed of the grid 1030 and the color filters 1040R, 1040G and 1040B.

Different from the image sensor 900 in FIG. 9A, the grid 1030 of the image sensor 1000 has a grid layer 1038 sandwiched between the substrate 1010 and the color filters 1040R, 1040G and 1040B. The material of the grid layer 1038 is same as the material of the grid 1030.

Figure 11:
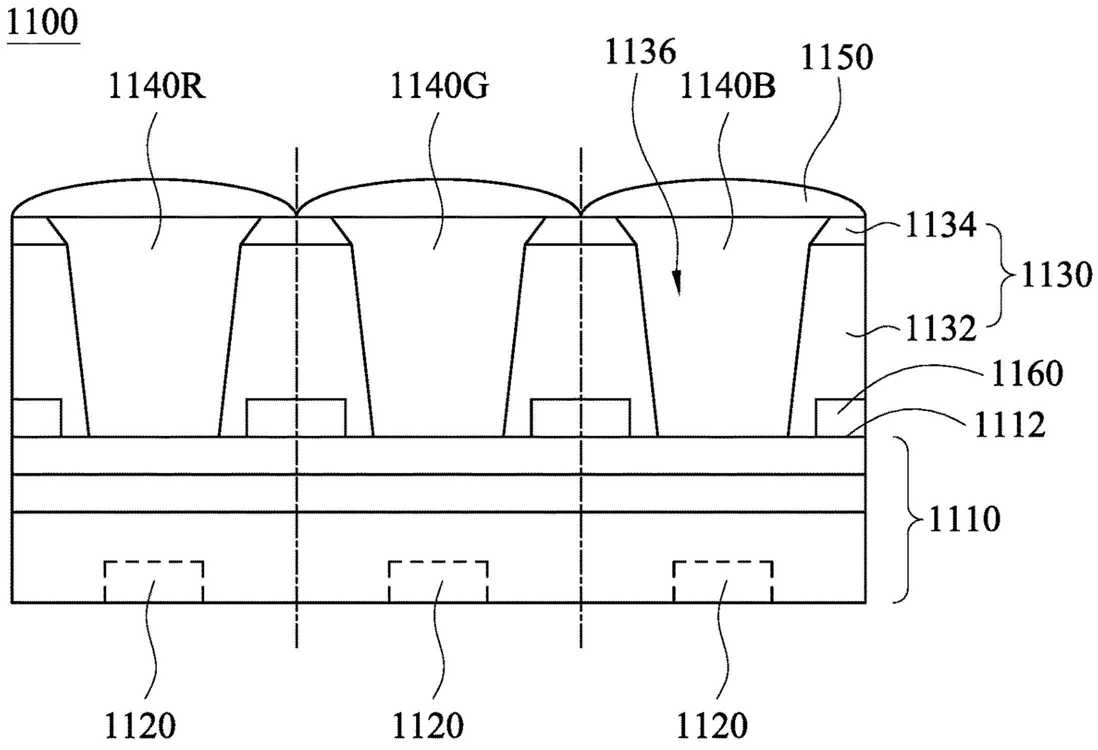

FIG. 11 is a schematic cross-sectional view of an image sensor 1100 according to various embodiments of the present disclosure. In FIG. 11, the image sensor 1100 includes a substrate 1110, an array of photosensitive units 1120, a first grid 1130, a second grid 1160, a plurality of color filters 1140R, 1140G and 1140B and a plurality of micro-lenses 1150.

In FIG. 11, the array of photosensitive units 1120 is disposed within the substrate 1110. The substrate 1110 has a surface 1112, and the first grid 1130 is disposed on the surface 1112 of the substrate 1110. The first grid 1130 has a first portion 1132, a second portion 1134 and a plurality of first openings 1136. The first openings 1136 are individually aligned to the photosensitive units 1120. The second portion 1134 is disposed on the first portion 1132. Referring to FIG. 11, the cross-sectional view of the first portion 1132 is in trapezoid, and the cross-sectional view of the second portion 1134 is in trapezoid.

The color filters 1140R, 1140G and 1140B are individually disposed within the first openings 1136 of the first grid 1130 and individually aligned to the photosensitive units 1120. In FIG. 11, the color filters 1140R, 1140G and 1140B contact the substrate 1110. The refractive index of the color filters 1140R, 1140G and 1140B is greater than the refractive index of the grid 1130. In various embodiments of the present disclosure, the grid 1130 and the array of color filters 1140R, 1140G and 1140B have a planarized co-plane.

The micro-lenses 1150 are disposed on the first grid 1130 and the color filters 1140R, 1140G and 1140B. More particularly, the micro-lenses 1150 are disposed on the planarized co-plane composed of the grid 1130 and the color filters 1140R, 1140G and 1140B.

Different from the image sensor 1000 in FIG. 10, the image sensor 1100 further includes the second grid 1160. The second grid 1160 is disposed on the surface 1112 of the substrate 1110, and then the first grid 1130 covers the second grid 1160. The second grid 1160 have a plurality of second openings, and the second openings are individually aligned to the first openings 1136. According to various embodiments of the present disclosure, the material of the second grid 1160 is a metal grid, and the metal includes titanium (Ti), tungsten (W), aluminum (Al), copper (Cu) and the combination thereof.

Figure 12:
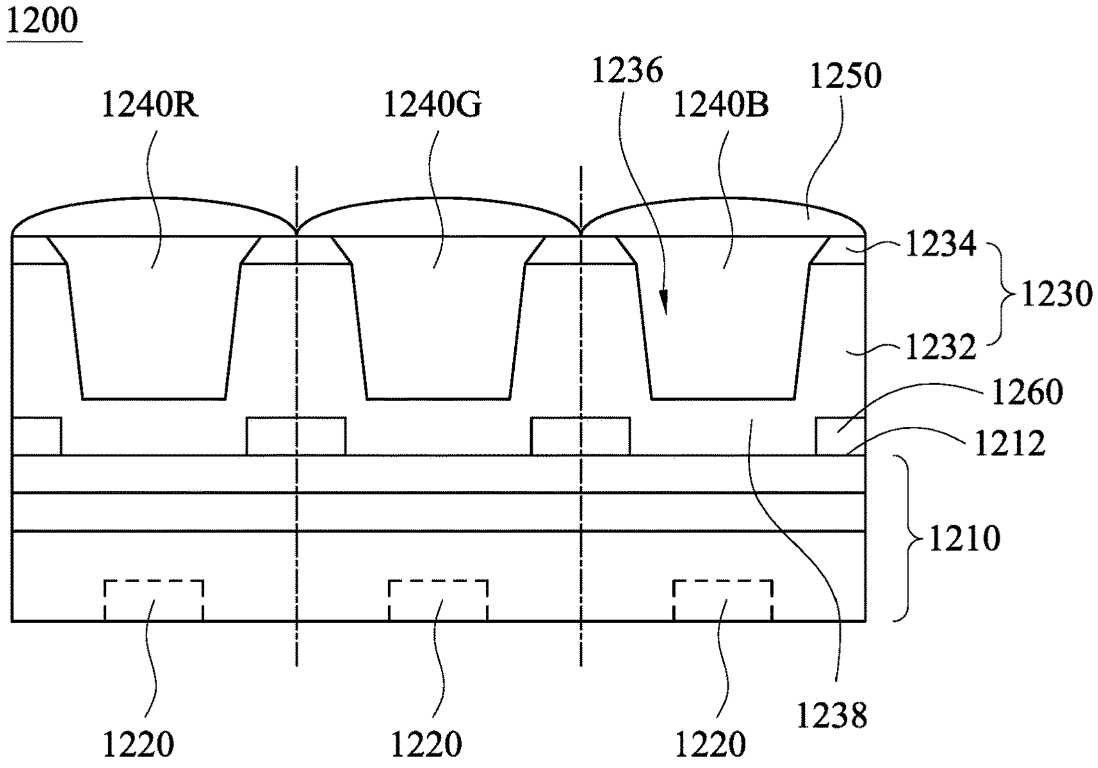

FIG. 12 is a schematic cross-sectional view of an image sensor 1200 according to various embodiments of the present disclosure. In FIG. 12, the image sensor 1200 includes a substrate 1210, an array of photosensitive units 1220, a first grid 1230, a second grid 1260, a plurality of color filters 1240R, 1240G and 1240B and a plurality of micro-lenses 1250.

In FIG. 12, the array of photosensitive units 1220 is disposed within the substrate 1210. The substrate 1210 has a surface 1212, and the first grid 1230 is disposed on the surface 1212 of the substrate 1210. The first grid 1230 has a first portion 1232, a second portion 1234 and a plurality of first openings 1236. The first openings 1236 are individually aligned to the photosensitive units 1220. The second portion 1234 is disposed on the first portion 1232. Referring to FIG. 12, the cross-sectional view of the first portion 1232 is in trapezoid, and the cross-sectional view of the second portion 1234 is in trapezoid.

The color filters 1240R, 1240G and 1240B are individually disposed within the first openings 1236 of the first grid 1230 and individually aligned to the photosensitive units 1220. The refractive index of the color filters 1240R, 1240G and 1240B is greater than the refractive index of the first grid 1230. In various embodiments of the present disclosure, the first grid 1230 and the array of color filters 1240R, 1240G and 1240B have a planarized co-plane.

The second grid 1260 is disposed on the surface 1212 of the substrate 1210, and then the first grid 1230 convers the second grid 1260. The second grid 1260 have a plurality of second openings, and the second openings are individually aligned to the first openings 1236.

The micro-lenses 1250 are disposed on the first grid 1230 and the color filters 1240R, 1240G and 1240B. More particularly, the micro-lenses 1250 are disposed on the planarized co-plane composed of the first grid 1230 and the color filters 1240R, 1240G and 1240B.

Different from the image sensor 1100 in FIG. 11, the first grid 1230 of the image sensor 1200 has a first grid layer 1238 sandwiched between the substrate 1210 and the color filters 1240R, 1240G and 1240B. The material of the grid layer 1238 is same as the material of the grid 1230.

Figure 13:
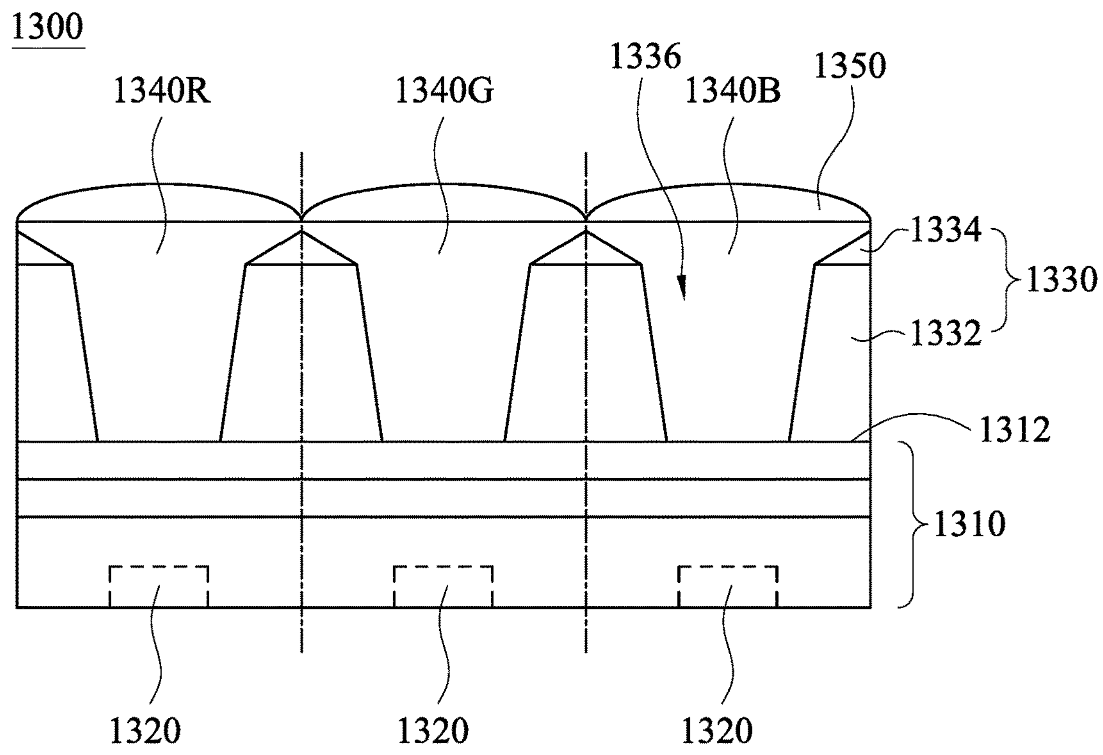

FIG. 13 is a schematic cross-sectional view of an image sensor 1300 according to various embodiments of the present disclosure. In FIG. 13, the image sensor 1300 includes a substrate 1310, an array of photosensitive units 1320, a grid 1330, a plurality of color filters 1340R, 1340G and 1340B and a plurality of micro-lenses 1350.

In FIG. 13, the array of photosensitive units 1320 is disposed within the substrate 1310. The substrate 1310 has a surface 1312, and the grid 1330 is disposed on the surface 1312 of the substrate 1310. The grid 1330 has a first portion 1332, a second portion 1334 and a plurality of openings 1336. The openings 1336 are individually aligned to the photosensitive units 1320. The second portion 1334 is disposed on the first portion 1332. Referring to FIG. 13, the cross-sectional view of the first portion 1332 is in trapezoid, and the cross-sectional view of the second portion 1334 is in triangle.

The color filters 1340R, 1340G and 1340B are individually disposed within the openings 1336 of the grid 1330 and individually aligned to the photosensitive units 1320. In FIG. 13, the color filters 1340R, 1340G and 1340B contact the substrate 1310. The refractive index of the color filters 1340R, 1340G and 1340B is greater than the refractive index of the grid 1330. In various embodiments of the present disclosure, the array of color filters 1340R, 1340G and 1340B covers the grid 1330, and has a planarized co-plane.

The micro-lenses 1350 are disposed on the color filters 1340R, 1340G and 1340B. More particularly, the micro-lenses 1350 are disposed on the planarized co-plane composed of the color filters 1340R, 1340G and 1340B.

Figure 14:
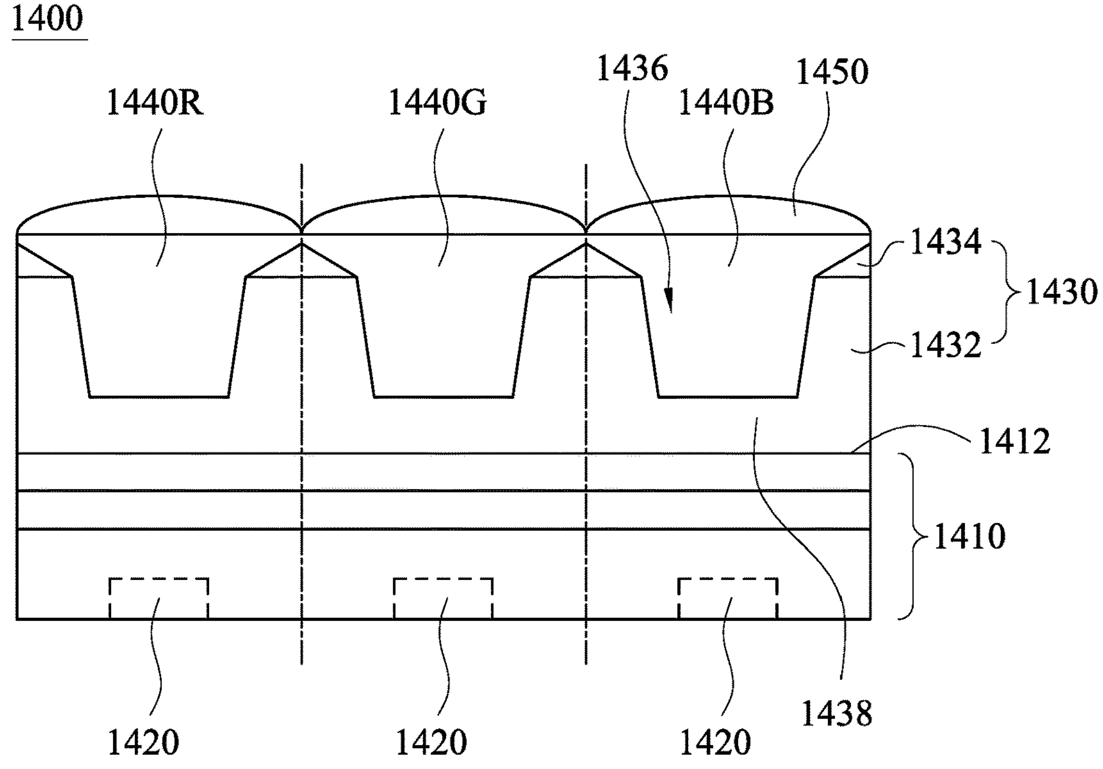

FIG. 14 is a schematic cross-sectional view of an image sensor 1400 according to various embodiments of the present disclosure. In FIG. 14, the image sensor 1400 includes a substrate 1410, an array of photosensitive units 1420, a grid 1430, a plurality of color filters 1440R, 1440G and 1440B and a plurality of micro-lenses 1450.

In FIG. 14, the array of photosensitive units 1420 is disposed within the substrate 1410. The substrate 1410 has a surface 1412, and the grid 1430 is disposed on the surface 1412 of the substrate 1410. The grid 1430 has a first portion 1432, a second portion 1434 and a plurality of openings 1436. The openings 1436 are individually aligned to the photosensitive units 1420. The second portion 1434 is disposed on the first portion 1432. Referring to FIG. 14, the cross-sectional view of the first portion 1432 is in trapezoid, and the cross-sectional view of the second portion 1434 is in triangle.

The color filters 1440R, 1440G and 1440B are individually disposed within the openings 1436 of the grid 1430 and individually aligned to the photosensitive units 1420. The refractive index of the color filters 1440R, 1440G and 1440B is greater than the refractive index of the grid 1430. In various embodiments of the present disclosure, the array of color filters 1440R, 1440G and 1440B covers the grid 1430, and has a planarized co-plane.

The micro-lenses 1450 are disposed on the color filters 1440R, 1440G and 1440B. More particularly, the micro-lenses 1450 are disposed on the planarized co-plane composed of the color filters 1440R, 1440G and 1440B.

Different from the image sensor 1300 in FIG. 13, the grid 1430 of the image sensor 1400 has a grid layer 1438 sandwiched between the substrate 1410 and the color filters 1440R, 1440G and 1440B. The material of the grid layer 1438 is same as the material of the grid 1430.

Figure 15:
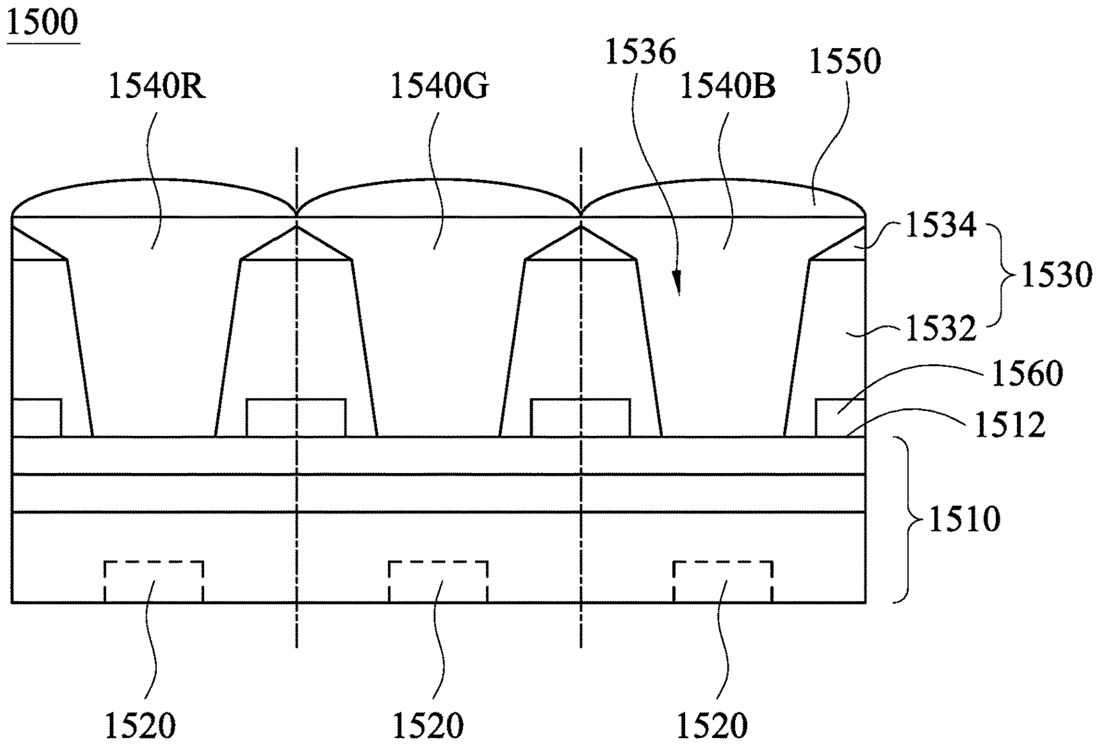

FIG. 15 is a schematic cross-sectional view of an image sensor 1500 according to various embodiments of the present disclosure. In FIG. 15, the image sensor 1500 includes a substrate 1510, an array of photosensitive units 1520, a first grid 1530, a second grid 1560, a plurality of color filters 1540R, 1540G and 1540B and a plurality of micro-lenses 1550.

In FIG. 15, the array of photosensitive units 1520 is disposed within the substrate 1510. The substrate 1510 has a surface 1512, and the first grid 1530 is disposed on the surface 1512 of the substrate 1510. The first grid 1530 has a first portion 1532, a second portion 1534 and a plurality of first openings 1536. The first openings 1536 are individually aligned to the photosensitive units 1520. The second portion 1534 is disposed on the first portion 1532. Referring to FIG. 15, the cross-sectional view of the first portion 1532 is in trapezoid, and the cross-sectional view of the second portion 1534 is in triangle.

The color filters 1540R, 1540G and 1540B are individually disposed within the first openings 1536 of the first grid 1530 and individually aligned to the photosensitive units 1520. In FIG. 15, the color filters 1540R, 1540G and 1540B contact the substrate 1510. The refractive index of the color filters 1540R, 1540G and 1540B is greater than the refractive index of the first grid 1530. In various embodiments of the present disclosure, the array of color filters 1540R, 1540G and 1540B covers the first grid 1530, and has a planarized co-plane.

The micro-lenses 1550 are disposed on the color filters 1540R, 1540G and 1540B. More particularly, the micro-lenses 1550 are disposed on the planarized co-plane composed of the color filters 1540R, 1540G and 1540B.

Different from the image sensor 1300 in FIG. 13, the image sensor 1500 further includes the second grid 1560. The second grid 1560 is disposed on the surface 1512 of the substrate 1510, and then the first grid 1530 covers the second grid 1560. The second grid 1560 have a plurality of second openings, and the second openings are individually aligned to the first openings 1536. According to various embodiments of the present disclosure, the material of the second grid 1560 is a metal grid, and the metal includes titanium (Ti), tungsten (W), aluminum (Al), copper (Cu) and the combination thereof.

Figure 16:
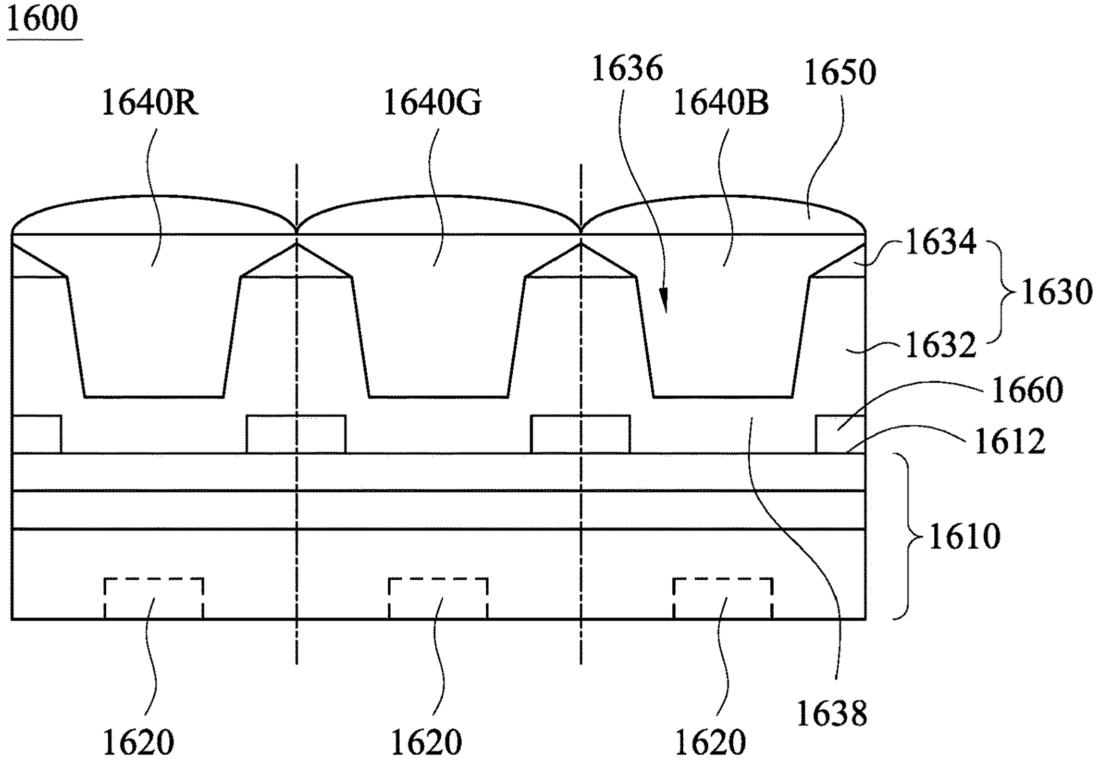

FIG. 16 is a schematic cross-sectional view of an image sensor 1600 according to various embodiments of the present disclosure. In FIG. 16, the image sensor 1600 includes a substrate 1610, an array of photosensitive units 1620, a first grid 1630, a second grid 1660, a plurality of color filters 1640R, 1640G and 1640B and a plurality of micro-lenses 1650.

In FIG. 16, the array of photosensitive units 1620 is disposed within the substrate 1610. The substrate 1610 has a surface 1612, and the first grid 1630 is disposed on the surface 1612 of the substrate 1610. The first grid 1630 has a first portion 1632, a second portion 1634 and a plurality of first openings 1636. The first openings 1636 are individually aligned to the photosensitive units 1620. The second portion 1634 is disposed on the first portion 1632. Referring to FIG. 16, the cross-sectional view of the first portion 1632 is in trapezoid, and the cross-sectional view of the second portion 1634 is in triangle.

The second grid 1660 is disposed on the surface 1612 of the substrate 1610, and then the first grid 1630 covers the second grid 1660. The second grid 1660 have a plurality of second openings, and the second openings are individually aligned to the first openings 1636.

The color filters 1640R, 1640G and 1640B are individually disposed within the first openings 1636 of the grid 1630 and individually aligned to the photosensitive units 1620. The refractive index of the color filters 1640R, 1640G and 1640B is greater than the refractive index of the grid 1630. In various embodiments of the present disclosure, the array of color filters 1640R, 1640G and 1640B covers the grid 1630, and has a planarized co-plane.

The micro-lenses 1650 are disposed on the color filters 1640R, 1640G and 1640B. More particularly, the micro-lenses 1650 are disposed on the planarized co-plane composed of the color filters 1640R, 1640G and 1640B.

Different from the image sensor 1500 in FIG. 15, the first grid 1630 of the image sensor 1600 has a first grid layer 1638 sandwiched between the substrate 1610 and the color filters 1640R, 1640G and 1640B. The material of the grid layer 1638 is same as the material of the grid 1630.

Figure 17:
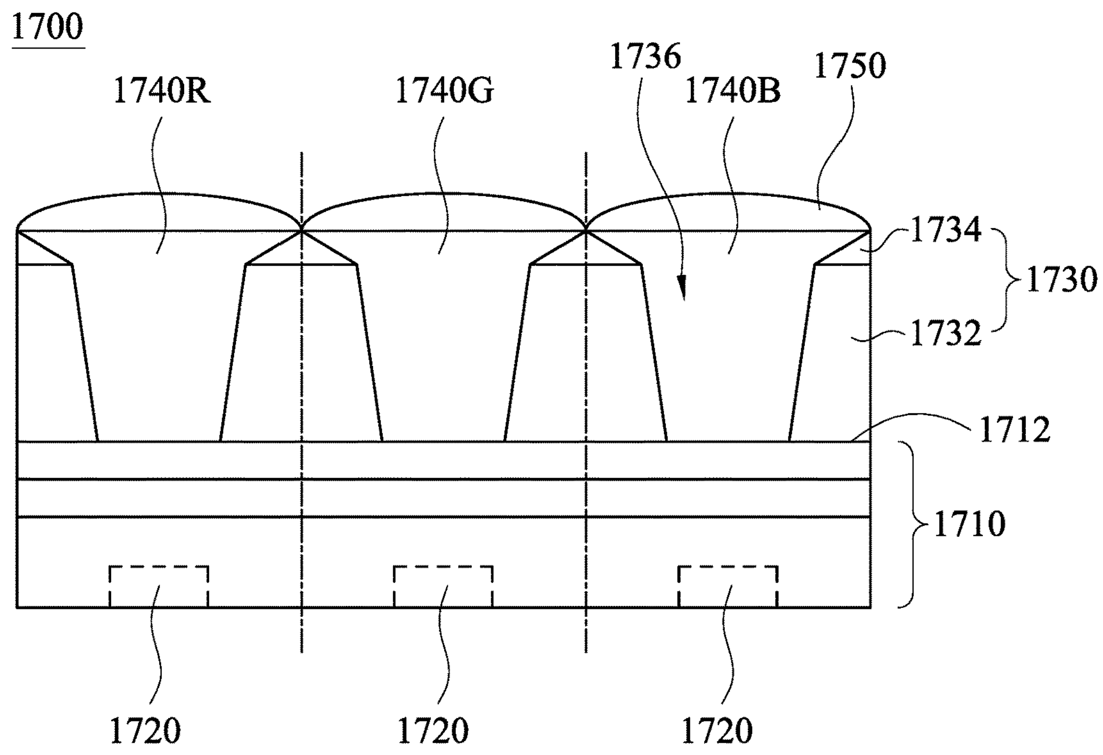

FIG. 17 is a schematic cross-sectional view of an image sensor 1700 according to various embodiments of the present disclosure. In FIG. 17, the image sensor 1700 includes a substrate 1710, an array of photosensitive units 1720, a grid 1730, a plurality of color filters 1740R, 1740G and 1740B and a plurality of micro-lenses 1750.

In FIG. 17, the array of photosensitive units 1720 is disposed within the substrate 1710. The substrate 1710 has a surface 1712, and the grid 1730 is disposed on the surface 1712 of the substrate 1710. The grid 1730 has a first portion 1732, a second portion 1734 and a plurality of openings 1736. The openings 1736 are individually aligned to the photosensitive units 1720. The second portion 1734 is disposed on the first portion 1732. Referring to FIG. 17, the cross-sectional view of the first portion 1732 is in trapezoid, and the cross-sectional view of the second portion 1734 is in triangle.

The color filters 1740R, 1740G and 1740B are individually disposed within the openings 1736 of the grid 1730 and individually aligned to the photosensitive units 1720. In FIG. 17, the color filters 1740R, 1740G and 1740B contact the substrate 1710. The refractive index of the color filters 1740R, 1740G and 1740B is greater than the refractive index of the grid 1730.

Different from the image sensor 1300 in FIG. 13, the grid 1730 and the array of color filters 1740R, 1740G and 1740B have a planarized co-plane. The micro-lenses 1750 are disposed on the grid 1730 and the color filters 1740R, 1740G and 1740B. More particularly, the micro-lenses 1750 are disposed on the planarized co-plane composed of the grid 1730 and the array of color filters 1740R, 1740G and 1740B.

Figure 18:
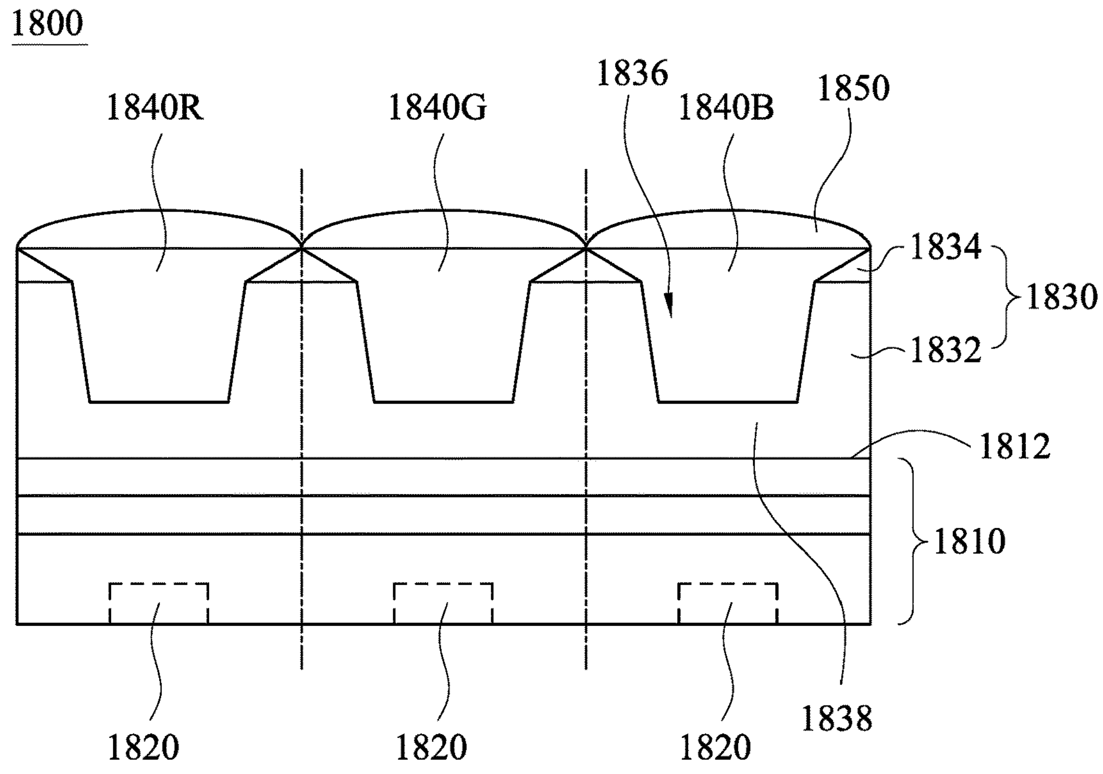

FIG. 18 is a schematic cross-sectional view of an image sensor 1800 according to various embodiments of the present disclosure. In FIG. 18, the image sensor 1800 includes a substrate 1810, an array of photosensitive units 1820, a grid 1830, a plurality of color filters 1840R, 1840G and 1840B and a plurality of micro-lenses 1850.

In FIG. 18, the array of photosensitive units 1820 is disposed within the substrate 1810. The substrate 1810 has a surface 1812, and the grid 1830 is disposed on the surface 1812 of the substrate 1810. The grid 1830 has a first portion 1832, a second portion 1834 and a plurality of openings

1836. The openings 1836 are individually aligned to the photosensitive units 1820. The second portion 1834 is disposed on the first portion 1832. Referring to FIG. 18, the cross-sectional view of the first portion 1832 is in trapezoid, and the cross-sectional view of the second portion 1834 is in triangle.

The color filters 1840R, 1840G and 1840B are individually disposed within the openings 1836 of the grid 1830 and individually aligned to the photosensitive units 1820. The refractive index of the color filters 1840R, 1840G and 1840B is greater than the refractive index of the grid 1830. The grid 1830 and the array of color filters 1840R, 1840G and 1840B have a planarized co-plane.

The micro-lenses 1850 are disposed on the grid 1830 and the color filters 1840R, 1840G and 1840B. More particularly, the micro-lenses 1850 are disposed on the planarized co-plane composed of the grid 1830 and the array of color filters 1840R, 1840G and 1840B.

Different from the image sensor 1700 in FIG. 17, the grid 1830 of the image sensor 1800 has a grid layer 1838 sandwiched between the substrate 1810 and the color filters 1840R, 1840G and 1840B. The material of the grid layer 1838 is same as the material of the grid 1830.

Figure 19:
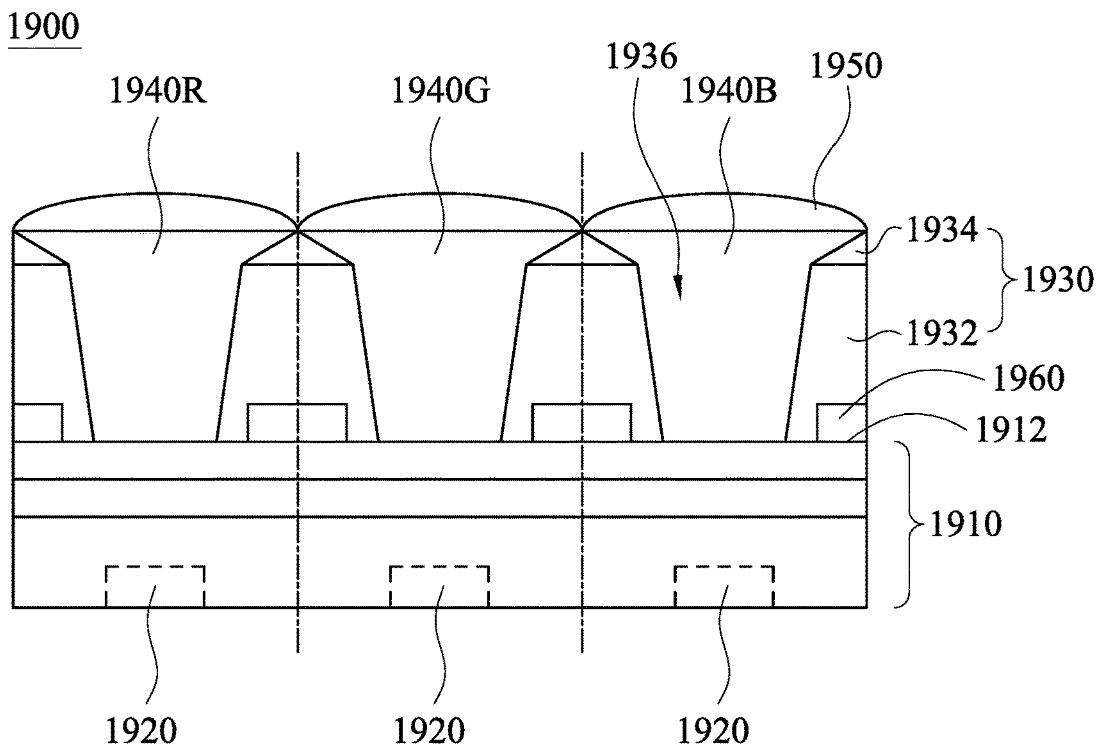

FIG. 19 is a schematic cross-sectional view of an image sensor 1900 according to various embodiments of the present disclosure. In FIG. 19, the image sensor 1900 includes a substrate 1910, an array of photosensitive units 1920, a first grid 1930, a second grid 1960, a plurality of color filters 1940R, 1940G and 1940B and a plurality of micro-lenses 1950.

In FIG. 19, the array of photosensitive units 1920 is disposed within the substrate 1910. The substrate 1910 has a surface 1912, and the first grid 1930 is disposed on the surface 1912 of the substrate 1910. The first grid 1930 has a first portion 1932, a second portion 1934 and a plurality of first openings 1936. The first openings 1936 are individually aligned to the photosensitive units 1920. The second portion 1934 is disposed on the first portion 1932. Referring to FIG. 19, the cross-sectional view of the first portion 1932 is in trapezoid, and the cross-sectional view of the second portion 1934 is in triangle.

The color filters 1940R, 1940G and 1940B are individually disposed within the first openings 1936 of the grid 1930 and individually aligned to the photosensitive units 1920. In FIG. 19, the color filters 1940R, 1940G and 1940B contact the substrate 1910. The refractive index of the color filters 1940R, 1940G and 1940B is greater than the refractive index of the first grid 1930. The first grid 1930 and the array of color filters 1940R, 1940G and 1940B have a planarized co-plane.

The micro-lenses 1950 are disposed on the first grid 1930 and the color filters 1940R, 1940G and 1940B. More particularly, the micro-lenses 1950 are disposed on the planarized co-plane composed of the first grid 1930 and the array of color filters 1940R, 1940G and 1940B.

Different from the image sensor 1700 in FIG. 17, the image sensor 1900 further includes the second grid 1960. The second grid 1960 is disposed on the surface 1912 of the substrate 1910, and then the first grid 1930 covers the second grids 1960. The second grid 1960 have a plurality of second openings, and the second openings are individually aligned to the first openings 1936. According to various embodiments of the present disclosure, the material of the second grid 1960 is a metal grid, and the metal includes titanium (Ti), tungsten (W), aluminum (Al), copper (Cu) and the combination thereof.

Figure 20:
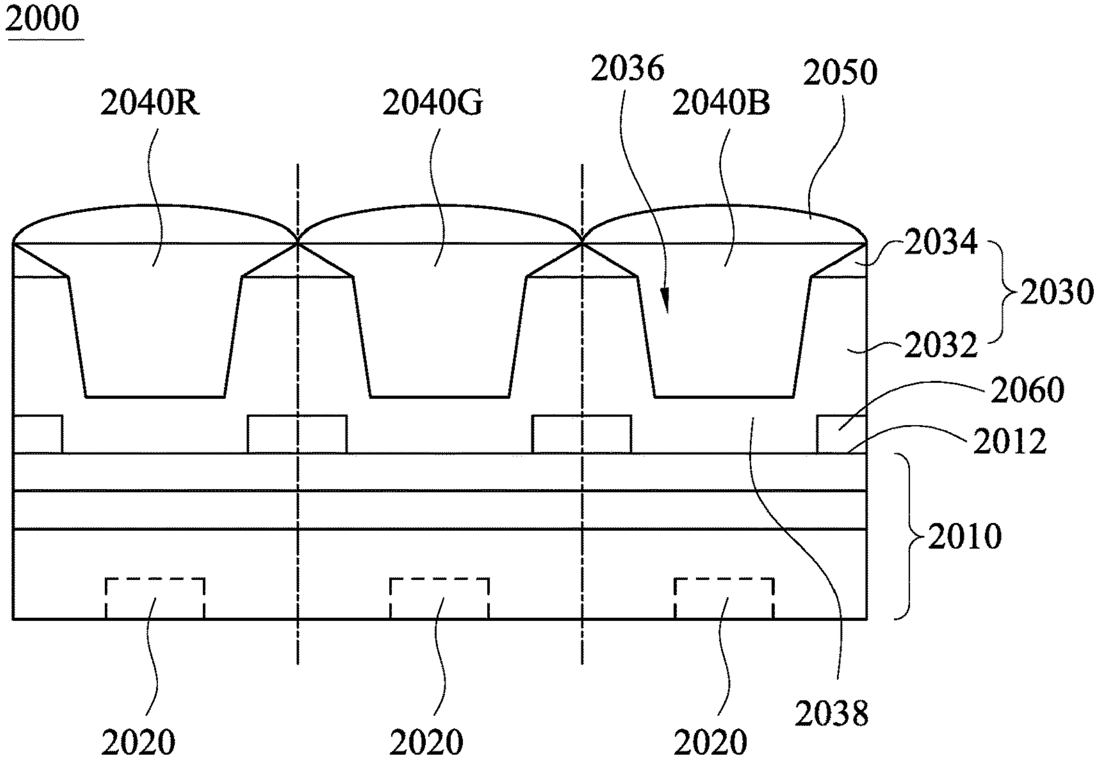

FIG. 20 is a schematic cross-sectional view of an image sensor 2000 according to various embodiments of the present disclosure. In FIG. 20, the image sensor 2000 includes a substrate 2010, an array of photosensitive units 2020, a first grid 2030, a second grid 2060, a plurality of color filters 2040R, 2040G and 2040B and a plurality of micro-lenses 2050.

In FIG. 20, the array of photosensitive units 2020 is disposed within the substrate 2010. The substrate 2010 has a surface 2012, and the first grid 2030 is disposed on the surface 2012 of the substrate 2010. The first grid 2030 has a first portion 2032, a second portion 2034 and a plurality of first openings 2036. The first openings 2036 are individually aligned to the photosensitive units 2020. The second portion 2034 is disposed on the first portion 2032. Referring to FIG. 20, the cross-sectional view of the first portion 2032 is in trapezoid, and the cross-sectional view of the second portion 2034 is in triangle.

The color filters 2040R, 2040G and 2040B are individually disposed within the first openings 2036 of the grid 2030 and individually aligned to the photosensitive units 2020. The refractive index of the color filters 2040R, 2040G and 2040B is greater than the refractive index of the first grid 2030. The first grid 2030 and the array of color filters 2040R, 2040G and 2040B have a planarized co-plane.

The second grid 2060 is disposed on the surface 2012 of the substrate 2010, and the then first grid 2030 covers the second grid 2060. The second grid 2060 have a plurality of second openings, and the second openings are individually aligned to the first openings 2036.

The micro-lenses 2050 are disposed on the first grid 2030 and the color filters 2040R, 2040G and 2040B. More particularly, the micro-lenses 2050 are disposed on the planarized co-plane composed of the first grid 2030 and the array of color filters 2040R, 2040G and 2040B.

Different from the image sensor 1900 in FIG. 19, the first grid 2030 of the image sensor 2000 has a first grid layer 2038 sandwiched between the substrate 2010 and the color filters 2040R, 2040G and 2040B. The material of the first grid layer 2038 is same as the material of the first grid 2030.

FIGS. 21A-21F are schematic cross-sectional views at various stages of fabricating an image sensor 2100 according to various embodiments of the present disclosure. The method is able to locally repair all types of aforementioned issues, so as to avoid the crosstalk occurring in the image sensor according to various embodiments of the present disclosure.

Figure 21A:
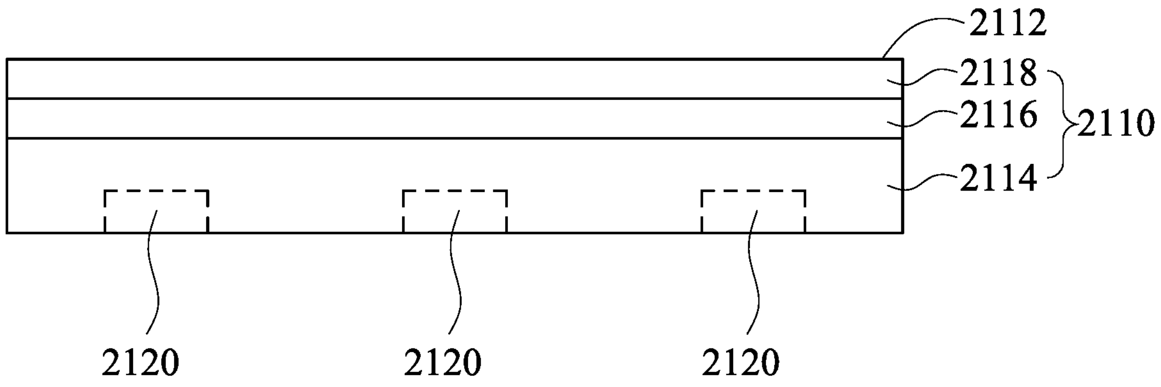
FIGS. 21A-21F are schematic cross-sectional views at various stages of fabricating an image sensor according to various embodiments of the present disclosure.

In FIG. 21A, a substrate 2110 is provided. The substrate 2110 has a surface 2112, and includes a semiconductor substrate 2114, an anti-reflective layer 2116 and a buffer layer 2118. The anti-reflective layer 2116 is formed on the semiconductor substrate 2114. In various embodiments of the present disclosure, forming the anti-reflective layer 2116 is formed by using a furnace or performing a sputtering process. In various embodiments of the present disclosure, the anti-reflective layer 2116 is formed of a high-K material including hafnium oxide ($HfO_2$), tantalum oxide ($Ta_2O_5$), zirconium oxide ($ZrO_2$) or aluminum oxide ($Al_2O_3$).

The buffer layer 2118 is formed on the anti-reflective layer 2116. In various embodiments of the present disclosure, forming the buffer layer 2118 is by performing physical vapor deposition (PVD), chemical vapor deposition (CVD), atomic layer deposition (ALD) or plasma-enhanced chemical vapor deposition (PECVD). In various embodiments of the present disclosure, the buffer layer 2118 is formed of a dielectric material including silicon oxide (SiO), silicon nitride (SiN) or silicon oxynitride (SiON).

Referring to FIG. 21A, an array of photosensitive units 2120 is formed within the substrate 2110. More particularly, the array of photosensitive units 2120 is formed within the semiconductor substrate 2114 of the substrate 2110.

Figure 21B:
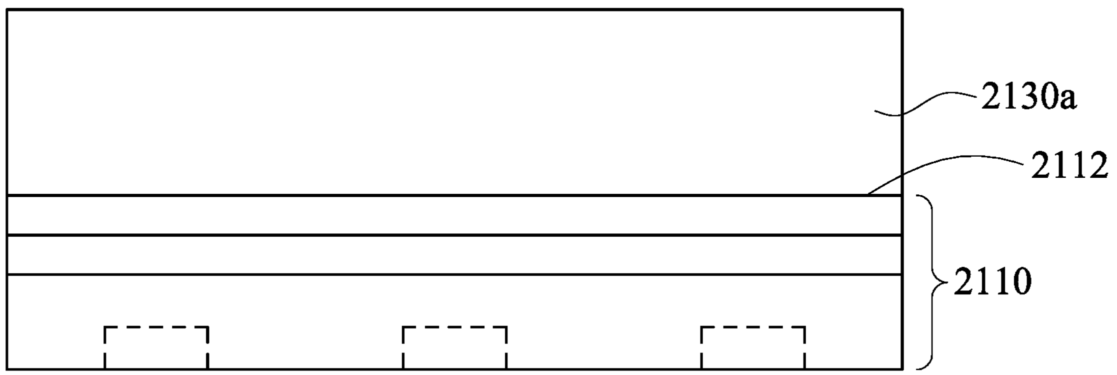

In FIG. 21B, a first grid layer 2130*a* is formed on the surface 2112 of the substrate 2110. In various embodiments of the present disclosure, forming the first grid layer 2130*a* includes forming a dielectric material layer. The dielectric material includes silicon oxide (SiO), silicon nitride (SiN) or silicon oxynitride (SiON). In various embodiments of the present disclosure, the first grid layer 2130*a* is by performing physical vapor deposition (PVD), chemical vapor deposition (CVD), atomic layer deposition (ALD) or plasma-enhanced chemical vapor deposition (PECVD).

In some cases, a second grid layer is formed on the substrate, and then the second grid layer is patterned to form a second grid. The second grid has a plurality of third openings, and third openings are individually aligned to the photosensitive units. The first grid layer is sequentially formed on the second grid. In various embodiments of the present disclosure, forming the second grid layer includes forming a metal layer. In various embodiments of the present disclosure, the second grid is formed of a metal including titanium (Ti), tungsten (W), aluminum (Al), copper (Cu) and the combination thereof. In various embodiments of the present disclosure, the second grid layer is by performing a sputtering process, a plating process or an evaporation process, and then patterned by performing an etching process to form the second grid.

Figure 21C:
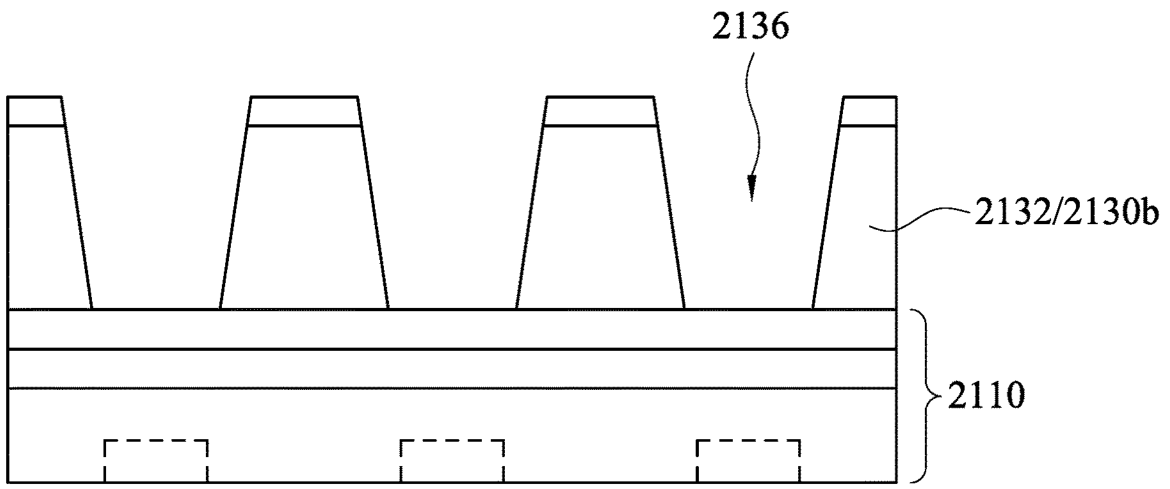

Referring to FIG. 21C, a first etching process is performed to the first grid layer 2130*a* to form a first portion 2132 of a first grid 2130*b*. The first grid 2130*b* has a plurality of first openings 2136. There is a first angle between a normal of the surface 2112 of the substrate 2110 and a surface of the first portion 2132. In various embodiments of the present disclosure, the first portion 2132 of the first grid 2130*b* is formed by an anisotropic etching process. In various embodiments of the present disclosure, the cross-sectional view of the first portion 2132 of the first grid 2130*b* is in rectangle or trapezoid.

Figure 21D:
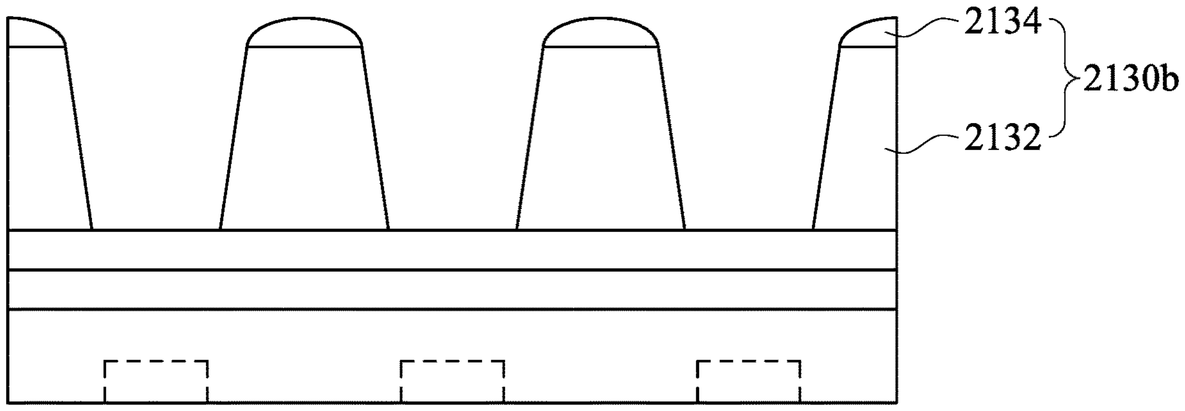

In FIG. 21D, a second etching process to the first grid 2130*b* to form a second portion 2134 of the first grid 2130*b*. There is a second angle between the normal of the surface 2112 of the substrate 2110 and at least one surface or at least one tangent plane of the surface of the second portion 2134. In various embodiments of the present disclosure, the second angle is greater than the first angle. In various embodiments of the present disclosure, the second portion 2134 of the first grid 2130*b* is formed by an isotropic etching process. In various embodiments of the present disclosure, the second portion 2134 of the first grid 2130*b* is formed to be in semi-circle, semi-ellipse, triangle or trapezoid.

Figure 21E:
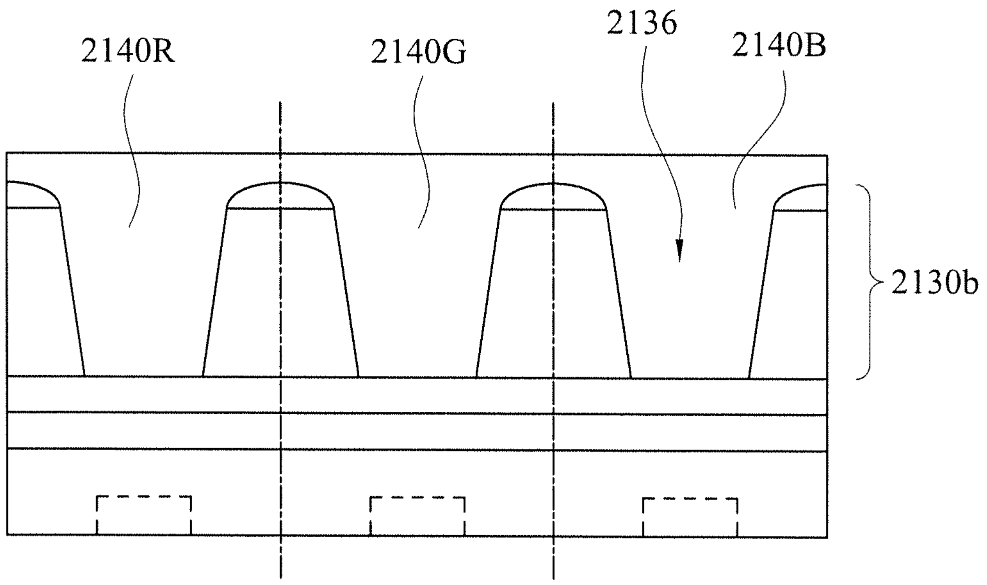

In FIG. 21E, a plurality of color filter materials are filled into the second openings 2136 of the first grid 2130*b* to form an array of color filters 2140R, 2140G and 2140B. Because the second openings 2136 of the first grid 2130*b* are individually aligned to the photosensitive units 2120, the color filters 2140R, 2140G and 2140B are also individually aligned to the photosensitive units 2120. In some cases, the color filters 2140R, 2140G and 2140B contact the surface 2112 of the substrate 2110 after filling the color filter materials into the second openings 2136. In other cases, there is a residue layer of the first grid layer 2130*a* between the substrate 2110 and the color filters 2140R, 2140G and 2140B. In various embodiments of the present disclosure, the color filters 2140R, 2140G and 2140B is by performing chemical vapor deposition (CVD). In various embodiments of the present disclosure, a planarized co-plane is formed on the color filters 2140R, 2140G and 2140B.

Figure 21F:
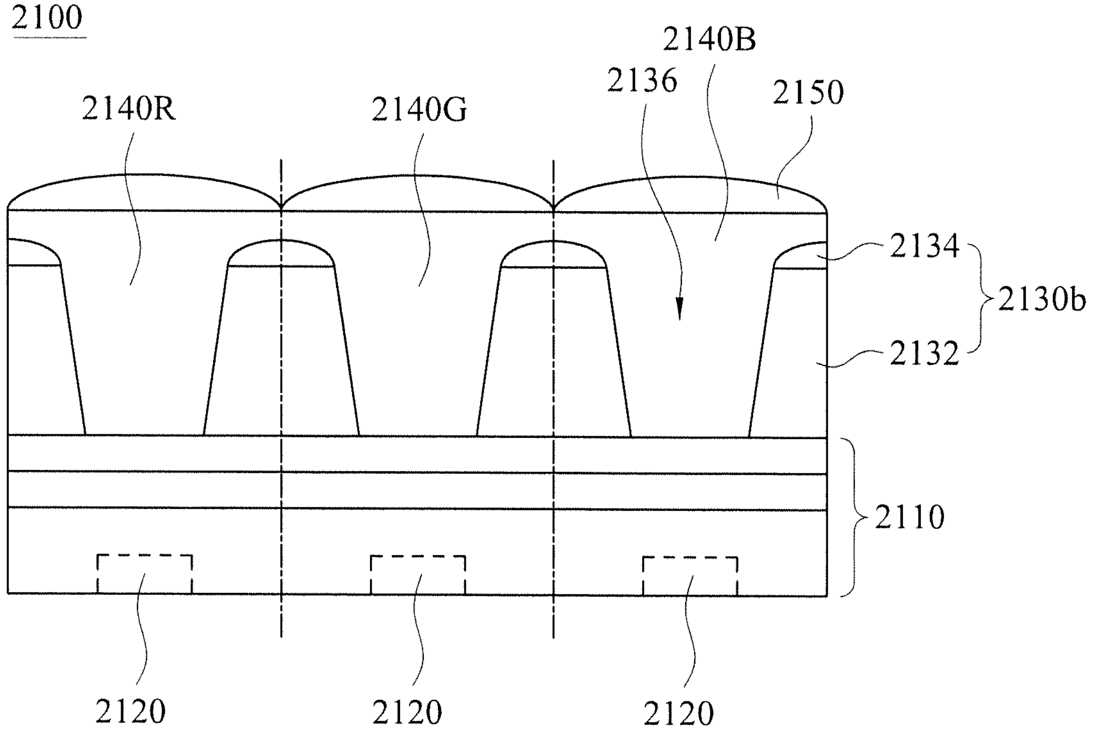

In various embodiments of the present disclosure, a plurality of micro-lenses 2150 are formed on the color filters 2140R, 2140G and 2140B, referring to FIG. 21F. More particularly, the micro-lenses 2150 are formed on the planarized co-plane composed of the color filters 2140R, 2140G and 2140B, and are individually aligned to the photosensitive units 2120. In FIG. 21F, the image sensor 2100 is then formed by the fabricating method including the various stages from FIGS. 21A to 21F.

Figure 22:
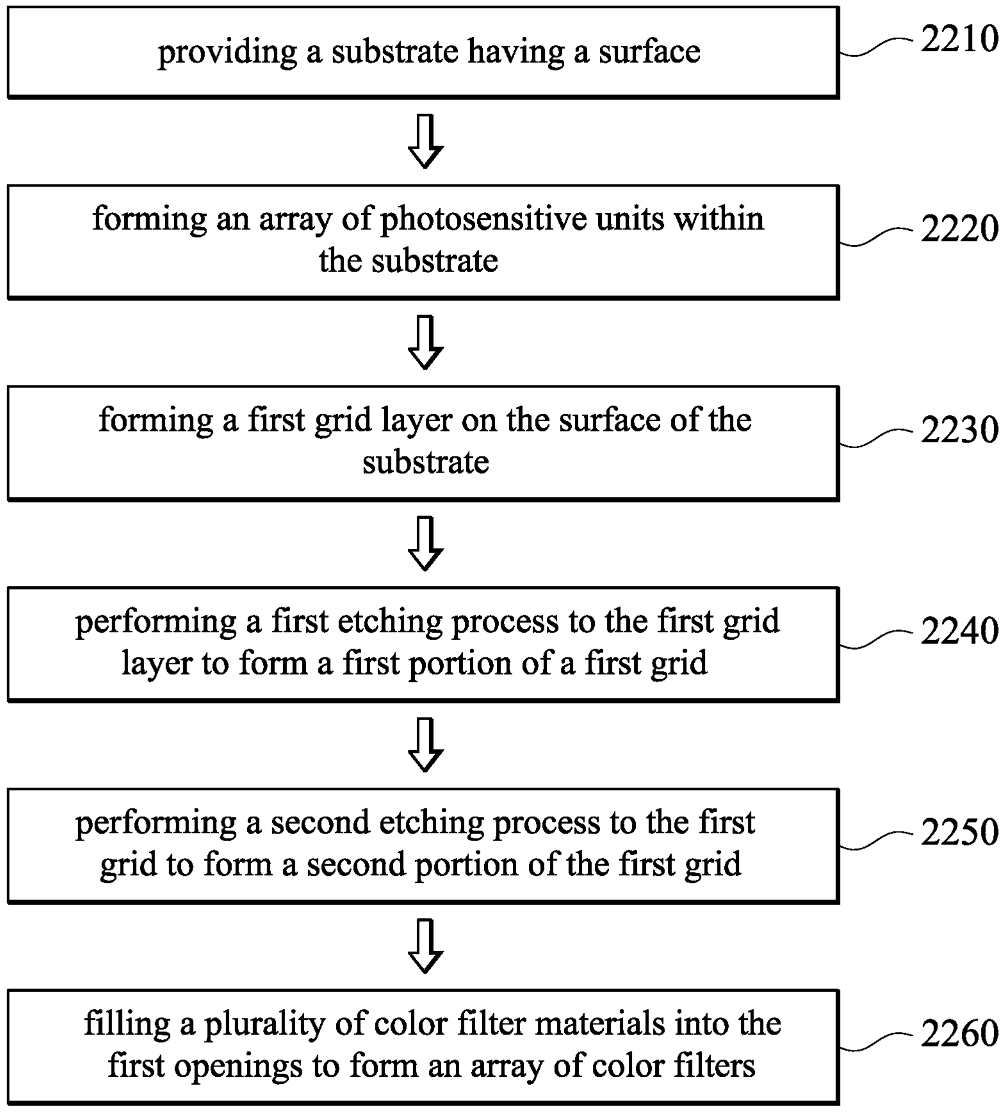
FIG. 22 is a flow chart illustrating a method of manufacturing an image sensor according to various embodiments of the present disclosure.

FIG. 22 is a flow chart illustrating a method of manufacturing an image sensor according to various embodiments of the present disclosure. The operations 2210 to 2260 are disclosed in association with the cross-sectional views of the image sensor 2100 from FIGS. 21A to 21F at various fabrication stages.

In the operation 2210, the substrate 2110 is provided. Referring to FIG. 21A, the substrate 2110 has the surface 2112, and includes the semiconductor substrate 2114, the anti-reflective layer 2116 and the buffer layer 2118. The anti-reflective layer 2116 is formed on the semiconductor substrate 2114, and the buffer layer 2118 is formed on the anti-reflective layer 2116.

Still referring to the operation 2220, the array of photosensitive units 2120 is formed within the substrate 2110. More particularly, the array of photosensitive units 2120 is formed within the semiconductor substrate 2114 of the substrate 2110.

In the operation 2230, the first grid layer 2130*a* is formed on the surface 2112 of the substrate 2110. Referring to FIG. 21B, the first grid layer 2130*a* is formed of a dielectric material. The dielectric material includes silicon oxide (SiO), silicon nitride (SiN) or silicon oxynitride (SiON). In various embodiments of the present disclosure, the first grid layer 2130*a* is by performing physical vapor deposition (PVD), chemical vapor deposition (CVD), atomic layer deposition (ALD) or plasma-enhanced chemical vapor deposition (PECVD).

According to various embodiments of the present disclosure, the fabricating method further includes forming a second grid layer on the substrate and patterning the second grid layer to form a second grid. The second grid has a plurality of third openings, and third openings are individually aligned to the photosensitive units. The first grid layer is sequentially formed on the second grid.

In various embodiments of the present disclosure, the second grid is formed of a metal including titanium (Ti), tungsten (W), aluminum (Al), copper (Cu) and the combination thereof. In various embodiments of the present disclosure, the second grid layer is by performing a sputtering process, a plating process or an evaporation process, and then patterned by performing an etching process to form the second grid.

In the operation 2240, a first etching process to the first grid layer 2130*a* to form a first portion 2132 of a first grid 2130*b*. Referring to FIG. 21C, the first grid 2130*b* has a plurality of first openings 2136. There is a first angle between a normal of the surface 2112 of the substrate 2110 and a surface of the first portion 2132. In various embodiments of the present disclosure, the first portion 2132 of the first grid 2130*b* is formed by an anisotropic etching process. In various embodiments of the present disclosure, the cross-sectional view of the first portion 2132 of the first grid 2130*b* is in rectangle or trapezoid.

In the operation 2250, a second etching process to the first grid 2130*b* to form a second portion 2134 of the first grid

2130*b*. Referring to FIG. 21D, There is a second angle between the normal of the surface 2112 of the substrate 2110 and at least one surface or at least one tangent plane of the surface of the second portion 2134. In various embodiments of the present disclosure, the second angle is greater than the first angle. In various embodiments of the present disclosure, the second portion 2134 of the first grid 2130*b* is formed by an isotropic etching process. In various embodiments of the present disclosure, the second portion 2134 of the first grid 2130*b* is formed to be in semi-circle, semi-ellipse, triangle or trapezoid.

In the operation 2260, a plurality of color filter materials are filled into the second openings 2136 of the first grid 2130*b* to form an array of color filters 2140R, 2140G and 2140B. Because the second openings 2136 of the first grid 2130*b* are individually aligned to the photosensitive units 2120, the color filters 2140R, 2140G and 2140B are also individually aligned to the photosensitive units 2120. Referring to FIG. 21E, the color filters 2140R, 2140G and 2140B contact the surface 2112 of the substrate 2110 after filling the color filter materials into the second openings 2136. In other cases, there is a residue layer of the first grid layer 2130*a* between the substrate 2110 and the color filters 2140R, 2140G and 2140B. In various embodiments of the present disclosure, the color filters 2140R, 2140G and 2140B is by performing chemical vapor deposition (CVD). In various embodiments of the present disclosure, a planarized co-plane is formed on the color filters 2140R, 2140G and 2140B.

Referring to FIG. 21F, a plurality of micro-lenses 2150 are formed on the color filters 2140R, 2140G and 2140B. More particularly, the micro-lenses 2150 are formed on the planarized co-plane composed of the color filters 2140R, 2140G and 2140B, and are individually aligned to the photosensitive units 2120. In FIG. 21F, the image sensor 2100 is then formed by the fabricating method including the various stages from FIGS. 21A to 21F.

In accordance with some embodiments, the present disclosure discloses an image sensor including a grid having a first portion and a second portion. The second portion is disposed on the first portion. Because the second angle between the normal of the surface of the substrate and at least one surface or at least one tangent plane of the surface of the second portion is greater than the first angle between a normal of the surface of the substrate and a surface of the first portion. Therefore, the second portion of the grid can cause reflection or refraction of incident lights targeted for one image sensor element back into the same image sensor element, so as to avoid crosstalk occurred.

In accordance with some embodiments, the present disclosure disclosed a method for fabricating an image sensor. In this method, a second portion of the grid is formed on a first portion of the grid. The first portion of the grid is by performing an anisotropic etching process; and the first portion of the grid is by performing an isotropic etching process. Therefore, the grid can be formed to have a plurality of angles between the surface of the grid and the normal of the surface of the substrate.

According to some embodiments, an image sensor includes a substrate, a photosensitive unit in the substrate, a dielectric grid over the substrate, and a color filter over the photosensitive unit and surrounded by the dielectric grid. The dielectric grid has a first portion and a second portion over the first portion, and the second portion of the dielectric grid has a rounded top surface extending upwards from a sidewall of the first portion of the dielectric grid. The color filter has a first portion lower than a lowermost portion of the rounded top surface of the second portion of the dielectric grid and a second portion higher than the lowermost portion of the rounded top surface of the second portion of the dielectric grid.

According to some embodiments, an image sensor includes a substrate, a photosensitive unit in the substrate, a dielectric grid over the substrate, and a color filter over the photosensitive unit and surrounded by the dielectric grid. The dielectric grid has a first portion and a second portion over the first portion, wherein the second portion of the dielectric grid has an inclined sidewall and a substantially flat top surface extending laterally from a top end of the inclined sidewall of the second portion of the dielectric grid.

According to some embodiments, an image sensor includes a substrate, a photosensitive unit in the substrate, a dielectric grid over the substrate, a color filter over the photosensitive unit and surrounded by the dielectric grid, and a buffer layer under and in contact with the color filter. The dielectric grid has a first portion and a second portion over the first portion, wherein a surface of the second portion of the dielectric grid extends upwards from a top end of a sidewall of the first portion of the dielectric grid, the sidewall of the first portion of the dielectric grid is steeper than said surface of the second portion of the dielectric grid extending upwards from the top end of the sidewall of the first portion of the dielectric grid. The sidewall of the first portion of the dielectric grid is free from coverage by the buffer layer.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An image sensor, comprising:

a substrate;

a photosensitive unit in the substrate;

a color filter over the photosensitive unit; and a grid over the substrate, wherein the grid comprises a first material portion and a second material portion over the first material portion, wherein the second material portion has a curved surface at a top of the second material portion, and wherein a top of the first material portion is recessed relative to a bottom of the color filter.

2. The image sensor according to claim 1, wherein the photosensitive unit is on an underside of the substrate, and wherein the grid is on an upper side of the substrate opposite the underside.

3. The image sensor according to claim 1, wherein the first material portion is conductive and comprises metal, and wherein the second material portion is dielectric.

4. The image sensor according to claim 1, wherein the grid surrounds and demarcates an opening filled by the color filter.

5. The image sensor according to claim 1, wherein a slope of the curved surface varies laterally.

6. The image sensor according to claim 1, wherein the first material portion has a single material composition that is conductive, and wherein the bottom of the color filter is closer to the first material portion than to the curved surface.

7. An image sensor, comprising:

a photosensitive unit disposed in a substrate;

a color filter over the photosensitive unit;

a grid over the substrate, wherein an interface between the grid and the color filter has a curved portion and a non-curved portion; and a grid layer adjacent to the grid, and between the color filter and the photosensitive unit, wherein the grid and the grid layer comprise a same material.

8. The image sensor according to claim 7, wherein the photosensitive unit and the grid are on opposite sides of the substrate, which respectively face away from the color filter and face the color filter.

9. The image sensor according to claim 7, further comprising:

an array of photosensitive units in the substrate and including the photosensitive unit, wherein the grid layer spans a width of the array of photosensitive units.

10. The image sensor according to claim 7, wherein the color filter directly contacts the grid layer.

11. The image sensor according to claim 7, wherein a top of the grid faces away from the substrate, and wherein the color filter directly contacts the top of the grid.

12. The image sensor according to claim 7, further comprising:

a second color filter neighboring the color filter;

wherein the curved portion extends from the non-curved portion to an interface between the color filter and the second color filter.

13. The image sensor according to claim 7, wherein the grid comprises a metal and a dielectric, and wherein the metal directly contacts the grid layer.

14. An image sensor, comprising:

a photosensitive unit disposed in a substrate;

a metal-containing dielectric layer over the substrate;

a grid over the metal-containing dielectric layer and having a first portion and a second portion, wherein the first portion is between the second portion and the substrate, and wherein the second portion has a curved surface facing away from the photosensitive unit;

a color filter laterally adjacent to the grid; and a grid layer adjacent to the grid, between the metal-containing dielectric layer and the color filter, wherein the grid layer comprises a same material as the grid.

15. The image sensor according to claim 14, wherein the photosensitive unit is on a first side of the substrate facing a first direction, and wherein the grid is on a second side of the substrate facing a second direction opposite the first direction.

16. The image sensor according to claim 14, wherein the metal-containing dielectric layer comprises tantalum oxide or hafnium oxide.

17. The image sensor according to claim 14, wherein the metal-containing dielectric layer is between the photosensitive unit and the color filter.

18. The image sensor according to claim 14, further comprising:

a silicon oxide layer between the metal-containing dielectric layer and the color filter, wherein the metal-containing dielectric layer directly contacts the substrate.

19. The image sensor according to claim 14, wherein the color filter has a surface facing the substrate and closer to the substrate than the curved surface.

20. The image sensor according to claim 14, wherein the color filter has a single material composition and overlaps with and conforms to the curved surface, and wherein a bottom of the color filter is closer to the metal-containing dielectric layer than to the curved surface.

* * * * *